(12) United States Patent
Takahashi et al.

(10) Patent No.: US 7,611,642 B2
(45) Date of Patent: Nov. 3, 2009

(54) OXYNITRIDE PHOSPHOR AND LIGHT EMITTING DEVICE

(75) Inventors: Kohsei Takahashi, Kobe (JP); Naoto Hirosaki, Tsukuba (JP)

(73) Assignees: Sharp Kabushiki Kaisha, Osaka (JP); National Institute for Materials Science, Ibaraki (JP)

(*) Notice: Subject to any disclaimer, the term of this patent is extended or adjusted under 35 U.S.C. 154(b) by 329 days.

(21) Appl. No.: 11/808,112

(22) Filed: Jun. 6, 2007

(65) Prior Publication Data

US 2007/0278930 A1    Dec. 6, 2007

(30) Foreign Application Priority Data

Jun. 6, 2006    (JP)    ............... 2006-157680

(51) Int. Cl.
C09K 11/64    (2006.01)

(52) U.S. Cl. .............. 252/301.4 F; 313/503; 257/98

(58) Field of Classification Search ........... 252/301.4 F; 313/503; 257/98
See application file for complete search history.

(56) References Cited

U.S. PATENT DOCUMENTS 6,670,748 B2    12/2003    Ellens et al.

FOREIGN PATENT DOCUMENTS

| JP | 9-153644 | 6/1997 |
| JP | 10-163535 | 6/1998 |
| JP | 2002-171000 | 6/2002 |
| JP | 2002-363554 | 12/2002 |
| JP | 2003-206481 | 7/2003 |
| JP | 2004-071357 | 3/2004 |
| JP | 2004-244560 | 9/2004 |
| JP | 2004-331934 | 11/2004 |
| JP | 2005-235934 | 9/2005 |

(Continued)

OTHER PUBLICATIONS

Hirosaki et al., (2005) "Characterization And Properties Of Green-Emitting β-Sialon: $Eu^{2+}$ Powder Phosphors For White Light-Emitting Diodes", *Applied Physics Letters* 86: 211905-1- 211905-3.

(Continued)

*Primary Examiner*—C. Melissa Koslow
(74) *Attorney, Agent, or Firm*—Morrison & Foerster LLP

(57) ABSTRACT

The present invention provides an oxynitride phosphor represented by a composition formula $M(1)_{1-j}M(2)_jSi_bAl_cO_dN_e$ (composition formula I) or a composition formula $M(1)_{1-a-j}M(2)_jCe_aSi_bAl_cO_dN_e$ (composition formula II) and containing 50% or more of a JEM phase, and a light emitting device including a semiconductor light emitting element emitting an excited light, a first phosphor that is the oxynitride phosphor according to the present invention that absorbs the excited light and emits a fluorescence, and a kind or a plurality of kinds of second phosphor(s) that absorb(s) the excited light and emit(s) a fluorescence having a longer wavelength than the fluorescence emitted by the first phosphor. Thereby, a novel oxynitride phosphor being capable of highly efficiently emitting mainly a light having a wavelength of 510 nm or less and a light emitting device using the same can be provided.

30 Claims, 10 Drawing Sheets

FOREIGN PATENT DOCUMENTS

| | | |
|---|---|---|
| JP | 2006-8721 | 1/2006 |
| JP | 2006-16413 | 1/2006 |
| JP | 2006-89547 | 4/2006 |
| WO | WO 2005/019376 | 3/2005 |
| WO | WO 2005/052087 A1 | 6/2005 |

OTHER PUBLICATIONS

Uheda et al., (2004) "Red Phosphors For Warm White Light-Emitting Diodes", 305th meeting digest of Phosphor Research Society: pp. 37-47.

Grins et al., (1995) "Preparation and Crystal Structure of $LaAl(Si_{6-z}Al_z)N_{10-z}O_z$", *Journal of Materials Chemistry* 5(11): pp. 2001-2006.

EMISSION SPECTRUM (Ca)

EXCITATION SPECTRUM (Sr)

OXYNITRIDE PHOSPHOR AND LIGHT EMITTING DEVICE

This nonprovisional application is based on Japanese Patent Application No. 2006-157680 filed with the Japan Patent Office on Jun. 6, 2006, the entire contents of which are hereby incorporated by reference.

BACKGROUND OF THE INVENTION

1. Field of the Invention

The present invention relates to an oxynitride phosphor and a light emitting device using the same.

2. Description of the Background Art

A semiconductor light emitting element such as light emitting diode (LED) has an advantage of being compact, requiring little power consumption, and being capable of stably performing high-intensity light emitting. Moreover, a light emitting device for obtaining a visible light by combining a semiconductor light emitting element and a phosphor has an advantage of the semiconductor light emitting element, and furthermore, can emit a light having a color according to purpose of use such as white and therefore, can be utilized for a liquid crystal display, a light source for a back light of a mobile telephone or a personal digital assistant, a display device utilized for indoor or outdoor advertisement and so forth, an indicator of each of portable appliances, a light source for an OA (office automation) equipment, and so forth.

In Japanese Patent Laying-Open No. 10-163535, there has been disclosed a light emitting device in which a semiconductor light emitting element emitting a blue or blue-violet light and one kind or two kinds of phosphor(s) are combined. Here, the phosphor(s) is/are selected so that an emission color of the semiconductor light emitting element and an emission color of the phosphor(s) have a relation of complementary colors to each other and emit a light having a pseudo white color.

Moreover, in Japanese Patent Laying-Open No. 09-153644, there has been disclosed a dot matrix type display device in which a group III nitride semiconductor emitting an ultraviolet light having an emission peak wavelength of 380 nm is used as an exciting light source and which has three kinds of phosphor layers emitting three primary color lights of red, green, and blue, respectively.

Furthermore, in Japanese Patent Laying-Open No. 2002-171000, there has been disclosed a light emitting device emitting a white light by using a semiconductor light emitting element emitting a light having a wavelength of 390 to 420 nm and using a phosphor excited by emission from this semiconductor light emitting element. Here, the semiconductor light emitting element emits a light having low visibility by human and therefore, its color tone hardly changes even when the light emission intensity or the light emitting wavelength of the semiconductor light emitting element is fluctuated. Moreover, a light having a wavelength of 390 to 420 nm is difficult to damage a device component such as resin dispersing the phosphor(s) and also has little harmful effect on a human body.

As a material for phosphors, conventionally, oxide or sulfide has been widely used. However, in recent years, examples of phosphors of oxynitride or nitride has been disclosed in Japanese Patent Laying-Open No. 2002-363554, Japanese Patent Laying-Open No. 2003-206481, International Publication No. WO2005/019376, and Naoto Hirosaki, Rong-Jun Xie, Koji Kimoto, Takashi Sekiguchi, Yoshinobu Yamamoto, Takayuki Suehiro, and Mamoru Mitomo, "Characterization and properties of green-emitting β-SiALON: $Eu^{2+}$ powder phosphors for white light-emitting diodes", Applied Physics Letters 86, 211905 (2005), and Kyota Uheda, Naoto Hirosaki, Hajime Yamamoto, Rong-Jun Xie, "Red phosphors for warm white light-emitting diodes" 305th meeting digest of Phosphor Research Society, 2004, pp. 37-47. Most of these phosphors are excited particularly by a light having a wavelength of 390 to 420 nm and thereby, light emission can be obtained highly efficiently and additionally, the phosphors have high chemical stability and high heat-resistance, and also have excellent characteristics such as small fluctuation of emission efficiency due to change of operating temperature.

Moreover, in Japanese Patent Laying-Open No. 2004-244560, a light emitting device having the following construction has been disclosed. The phosphor $(Ca_{0.93}, Eu_{0.05}, Mn_{0.02})_{10}(PO_4)_6Cl_2$, the phosphor $(Ca_{0.955}Ce_{0.045})_2(Si_{0.964}Al_{0.036})_5N_8$, and the phosphor $SrCaSi_5N_8:Eu$ have emission peak wavelengths in a region of blue violet to blue series, in a region of blue green to green, and in a region of yellow red to red series, respectively. It is supposed that by mixed colors of lights from these phosphors, the emission color is shown in a white-based region.

It is known that among oxynitride phosphors, a JEM phase phosphor disclosed in International Publication No. WO 2005/019376 is a silicon oxynitride phosphor having a JEM phase, which is a crystal phase that is different from α-Sialon and β-Sialon, and the phosphor shows nonconventional emitting of an intensive blue light by exciting of a near ultraviolet radiation.

Moreover, in Japanese Patent Laying-Open No. 2004-071357, as a conventional technology corresponding to one embodiment of the present invention, there has been disclosed a light emitting device in which a semiconductor light emitting element, phosphors that are a red phosphor, a green phosphor, and a blue phosphor are placed in order and thereby resorption of lights emitted from the phosphors near the semiconductor light emitting element is suppressed.

Furthermore, in Japanese Patent Laying-Open No. 2004-331934, there has been disclosed a red phosphor $La_2O_2S$: Eu+Si in which powder reflectances in wavelengths of 450 nm, 545 nm, and 624 nm, which are wavelengths that are of red and shorter than that of red, are 84% or more, 94% or more, and 97% or more, respectively.

SUMMARY OF THE INVENTION

For example, for realizing a semiconductor light emitting device in which a semiconductor light emitting element emitting a light having a wavelength of 390 to 420 nm is used as an exciting light source, phosphors emitting lights highly efficiently over a wide region of blue, green, and red visible lights are required. Before now, as the phosphors that are excited by a light of a wavelength of 390 to 420 nm and emit a light, phosphors having emission colors of red and green have been obtained. However, a phosphor having excellent emission efficiency of a light of blue to blue-violet with a wavelength of 510 nm or less and having sufficient stability has not been found yet.

The present invention has been achieved in order to solve the above-described problems and, an object thereof is to provide a novel oxynitride phosphor that has excellent environment-resistance and excellent temperature-stability and can highly efficiently emit a light mainly having a wavelength of 510 nm or less, and to provide a light emitting device using the same.

The oxynitride phosphor (hereinafter, called as "first oxynitride phosphor of the present invention") according to a first aspect of the present invention is represented by a composition formula $M(1)_{1-j}M(2)_jSi_bAl_cO_dN_e$ (composition formula I) and contains 50% or more of a JEM phase. In the above-described composition formula I, the M(1) represents La, or a material in which La serves as a main component and in which at least one kind of chemical element(s) selected from a group composed of Ce, Pr, Nd, Sm, Eu, Gd, Tb, Dy, Ho, Er, Tm, Yb, and Lu serve(s) as accessory component(s), the M(2) represents at least one kind of alkaline-earth metal(s), the b representing a composition ratio of Si is a real number complying with $b=(6-z)\times f$, the c representing a composition ratio of Al is a real number complying with $c=(1+z)\times g$, the d representing a composition ratio of O is a real number complying with $d=z\times h$, and the e representing a composition ratio of N is a real number complying with $e=(10-z)\times i$. Moreover, in the above-described composition formula I, the z is a real number complying with $0.1 \leq z \leq 3$, the f is a real number complying with $0.7 \leq f \leq 1.3$, the g is a real number complying with $0.7 \leq g \leq 3$, the h is a real number complying with $0.7 \leq h \leq 3$, the i is a real number complying with $0.7 \leq i \leq 1.3$, and a composition ratio j of the alkaline-earth metal(s) is $0 < j \leq 1$.

Such first oxynitride phosphor of the present invention containing an alkaline-earth metal(s) and having a JEM phase of high emission efficiency has excellent environment-resistance and excellent temperature-stability and can highly effectively emit a light mainly having a wavelength of 510 nm or less and therefore, by setting its light absorbance to be low in a region of longer wavelengths than those of fluorescence, favorable emission efficiency can be realized.

It is preferable that the first oxynitride phosphor of the present invention contains 50% or more of a JEM phase represented by a formula $M(1)_{1-j}M(2)_jAl(Si_{6-z}Al_z)N_{10-z}O_z$, and containing 70% or more is more preferable.

Moreover, the oxynitride phosphor (hereinafter, called as "second oxynitride phosphor of the present invention") according to a second aspect of the present invention is represented by a composition formula $M(1)_{1-a-j}M(2)_jCe_aSi_bAl_cO_dN_e$ (composition formula II) and contains 50% or more of a JEM phase. In the above-described composition formula II, the M(1) represents La, or a material in which La serves as a main component and in which at least one kind of chemical elements selected from a group composed of Pr, Nd, Sm, Eu, Gd, Tb, Dy, Ho, Er, Tm, Yb, and Lu serve(s) as accessory component(s), the M(2) represents at least one kind of alkaline-earth metal(s), the a representing a composition ratio of Ce is a real number complying with $0.1 \leq a \leq 1$, the b representing a composition ratio of Si is a real number complying with $b=(6-z)\times f$, the c representing a composition ratio of Al is a real number complying with $c=(1+z)\times g$, the d representing a composition ratio of O is a real number complying with $d=z\times h$, and the e representing a composition ratio of N is a real number complying with $e=(10-z)\times i$. Moreover, in the above-described composition formula II, the z is a real number complying with $0.1 \leq z \leq 3$, the f is a real number complying with $0.7 \leq f \leq 1.3$, the g is a real number complying with $0.7 \leq g \leq 3$, the h is a real number complying with $0.7 \leq h \leq 3$, the i is a real number complying with $0.7 \leq i \leq 1.3$, and a composition ratio j of the alkaline-earth metal(s) is $0 < j < 1-a$.

Such second oxynitride phosphor of the present invention containing an alkaline-earth metal(s) and having a JEM phase of high emission efficiency has excellent environment-resistance and excellent temperature-stability and can highly effectively emit a light mainly having a wavelength of 510 nm or less and therefore, by setting its light absorbance to be low in a region of longer wavelengths than those of fluorescence, favorable emission efficiency can be realized.

It is preferable that the second oxynitride phosphor of the present invention contains 50% or more of a JEM phase represented by a formula $M(1)_{1-a-j}M(2)_jCe_aAl(Si_{6-z}Al_z)N_{10-z}O_z$, and containing 70% or more is more preferable.

It is preferable that in both of the above-described first oxynitride phosphor of the present invention and the above-described second oxynitride phosphor of the present invention, the emission peak wavelengths are 450 to 510 nm.

Furthermore, it is preferable that in both of the above-described first oxynitride phosphor of the present invention and the above-described second oxynitride phosphor of the present invention, the d is a real number complying with $1 < d \leq 2$ and the e is a real number complying with $8 < e < 9$.

In the second oxynitride phosphor of the present invention, it is preferable that the alkaline-earth metal(s) contain(s) any one of calcium, strontium, and barium. In the case that the alkaline-earth metal is calcium, it is preferable that a composition ratio of the calcium is $0 < j < 0.75$, and $0 < j < (1-a) \times 0.75$ is particularly preferable. Moreover, in the case that the alkaline-earth metal is strontium, it is preferable that a composition ratio of the strontium is $0 < j < 0.85$, and $0 < j < (1-a) \times 0.85$ is particularly preferable. Moreover, in the case that the alkaline-earth metal is barium, it is preferable that a composition ratio of the barium is $0 < j < 0.5$, and $0 < j < (1-a) \times 0.5$ is particularly preferable.

It is preferable that in both of the first oxynitride phosphor of the present invention and the second oxynitride phosphor of the present invention, an absorbance of a light having a wavelength of 510 to 800 nm is 30% or less.

The present invention also provides a light emitting device containing, a semiconductor light emitting element emitting an excited light, a first phosphor that is the oxynitride phosphor of any one of the above-described present inventions that absorbs the excited light and emits a fluorescence, and a kind or a plurality of kinds of second phosphor(s) that absorb(s) the excited light and emit(s) a fluorescence having a longer wavelength than the fluorescence emitted by the first phosphor.

According to the light emitting device of the present invention in which an oxynitride phosphor of the present invention is used as a first phosphor and a second phosphor emitting a light having a longer wavelength than the light emitted by the first phosphor is combined therewith, the first phosphor has a low light-absorbance in an emission peak wavelength of the second phosphor and the emission efficiency of the first phosphor can be improved and therewith, absorption of the light emitted from the second phosphor by the first phosphor is small and therefore, as a result, the emission efficiency of the whole device is excellent.

In the light emitting device of the present invention, it is preferable that an emission peak wavelength of the first phosphor is 450 to 510 nm. Moreover, in the light emitting device of the present invention, it is preferable that an emission spectrum full width at half maximum of the first phosphor is 80 nm or more. Furthermore, in the light emitting device of the present invention, it is preferable that a chromaticity coordinate x of emission of the first phosphor is 0.05 to 0.25, and a chromaticity coordinate y thereof is 0.02 to 0.38.

Moreover, in the light emitting device of the present invention, it is preferable that one main kind of emission peak wavelength of the second phosphor(s) is 565 to 605 nm. Moreover, in the light emitting device of the present invention, it is preferable that one main kind of an emission spectrum full width at half maximum of the second phosphor(s) is 80 nm or more.

Furthermore, in the light emitting device of the present invention, it is preferable that the second phosphor(s) include(s) an oxynitride phosphor or a nitride phosphor. In the case that the second phosphor(s) include(s) an oxynitride phosphor, it is more preferable that the oxynitride phosphor includes an Eu-activated α-Sialon phosphor or an Eu-activated β-Sialon phosphor. Moreover, in the case that the second phosphor(s) include(s) a nitride phosphor, it is more preferable that the nitride phosphor includes Eu-activated GaAlSiN$_3$.

Moreover, in the light emitting device of the present invention, it is preferable that an emission peak wavelength of the excited light is 350 to 420 nm.

In the light emitting device of the present invention, it is preferable that a chromaticity coordinate x of emission is 0.22 to 0.44 and a chromaticity coordinate y thereof is 0.22 to 0.44, or a chromaticity coordinate x of emission of the light emitting device is 0.36 to 0.5 and a chromaticity coordinate y thereof is 0.33 to 0.46.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
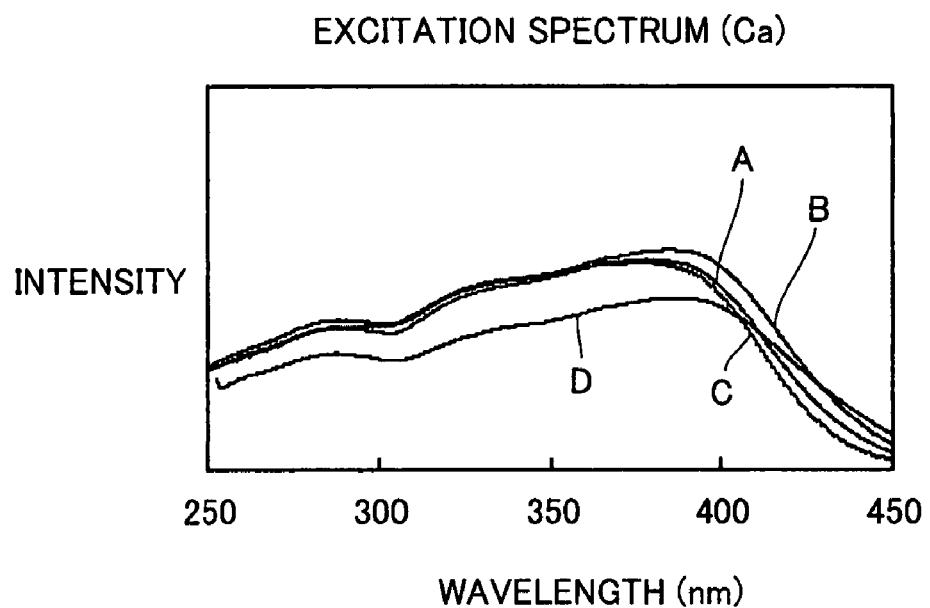
FIG. 1 is an excitation spectrum in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents intensity, and the horizontal axis represents wavelength (nm).

It is presupposed that a first oxynitride phosphor of the present invention is represented by a composition formula $M(1)_{1-j}M(2)_j Si_b Al_c O_d N_e$ (composition formula I). In the composition formula I, the M(1) represents La (lanthanum), or a material in which La serves as a main component and in which at least one kind of chemical element(s) selected from a group composed of Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), and Lu (lutetium) serve(s) as accessory component(s). Here, in the case that La serves as a main component, a rate of content of La in the M(1) is 50% or more, and preferably 70% or more. In the case that a rate of content of La in the M(1) is less than 50% (that is, in the case that La is not the main component of the M(1)), it is difficult that a JEM phase is stably formed. In addition, the rate of content of La in the M(1) in the oxynitride phosphor can be measured by, for example, inductively coupled plasma emission (ICP) analysis and so forth.

In the composition formula I representing the first oxynitride phosphor of the present invention, the M(2) represents at least one kind of alkaline-earth metal(s). The alkaline-earth metal includes, for example, Ca (calcium), Sr (strontium), Ba (barium), Be (beryllium), Mg (magnesium), Ra (Radium), and so forth. Among them, Ca, Sr, or Ba, which has an ion radius that is analogous to that of a rare earth such as La, is preferable.

In the composition formula I, a composition ratio (concentration) j of the alkaline-earth metal(s) is selected from the range of $0 < j \leq 1$, and a preferable range in the range is different according to kind of alkaline-earth metal, and, for example, in the case that the alkaline-earth metal is Ca, $0 < j < 0.75$ is preferable, and, for example, in the case that the alkaline-earth metal is Sr, $0 < j < 0.85$ is preferable, and, for example, in the case that the alkaline-earth metal is Ba, $0 < j < 0.5$ is preferable. In addition, the composition ratio of M(1) in the composition formula I is selected so as to be $1-j$ according to the composition ratio j of the alkaline-earth metal(s).

In the composition formula I, the b representing a composition ratio of Si is a real number complying with $b = (6-z) \times f$. Here, the z is a real number complying with $0.1 \leq z \leq 3$, and the f is a real number complying with $0.7 \leq f \leq 1.3$.

Moreover, in the composition formula I, the c representing a composition ratio of Al is a real number complying with $c = (1+z) \times g$. Here, the z is a real number complying with $0.1 \leq z \leq 3$ as described above, and the g is a real number complying with $0.7 \leq g \leq 3$.

In the composition formula I, the d representing a composition ratio of O is a real number complying with $d = z \times h$. Here, the z is a real number complying with $0.1 \leq z \leq 3$ as described above, and the h is a real number complying with $0.7 \leq h \leq 3$.

Moreover, in the composition formula I, the e representing a composition ratio of N is a real number complying with $e = (10-z) \times i$. Here, the z is a real number complying with $0.1 \leq z \leq 3$ as described above, and the i is a real number complying with $0.7 \leq i \leq 1.3$.

Moreover, in the first oxynitride phosphor of the present invention, it is preferable that in the composition formula I, the d representing a composition ratio of O is a real number complying with $1 < d \leq 2$ and the e representing a composition ratio of N is a real number complying with $8 < e < 9$. In the case that values are out of the above-described range, a JEM phase is prone to be difficult to be stably formed.

In addition, the composition ratios j, b, and c in the first oxynitride phosphor of the present invention represented by a composition formula $M(1)_{1-j}M(2)_j Si_b Al_c O_d N_e$ (composition formula I) can be measured by, for example, an ICP analysis, and the composition ratios d and e can be measured by using, for example, an apparatus for measuring oxygen and nitrogen (TC-436 type, manufactured by LECO. Inc).

The first oxynitride phosphor of the present invention is represented by a composition formula $M(1)_{1-j}M(2)_j Si_b Al_c O_d N_e$ (composition formula I) as described above, and contains 50% or more of a JEM phase. It was confirmed that an oxynitride material containing a JEM phase is a substance being generated in a process of controlling α-Sialon stabilized by a rare earth by Jekabs Grins et al. (Jekabs Grins et al., "Journal of Materials Chemistry", (1995), vol. 5, November, 2001-2006). According to this report, a JEM phase is generally represented by a formula $M^1 Al(Si_{6-z}Al_z)N_{10-z}O_z$ (however, $M^1$ is at least one kind of chemical element(s) selected from a group composed of La, Ce, Pr, Nd, Sm, Eu, Gd, Tb, Dy, Ho, Er, Tm, Yb, and Lu) and is made of a composition having a parameter of z and a crystal phase having a specific atomic arrangement and therefore, is a substance having excellent heat resistance. Its character is defined as a substance having a crystal structure (Pbcn space group) characterized by a specific atom site occupation (atomic arrangement structure) as described in the following Table 1 and by its coordinates.

TABLE 1

| | Atom | Site | Coordinate (x) | Coordinate (y) | Coordinate (z) |
|---|---|---|---|---|---|
| (1) | RE | 8d | 0.0553 | 0.0961 | 0.1824 |
| (2) | Al | 4c | 0 | 0.427 | 0.25 |
| (3) | M(1) | 8d | 0.434 | 0.185 | 0.057 |
| (4) | M(2) | 8d | 0.27 | 0.082 | 0.52 |
| (5) | M(3) | 8d | 0.293 | 0.333 | 0.337 |
| (6) | X(1) | 8d | 0.344 | 0.32 | 0.14 |
| (7) | X(2) | 8d | 0.383 | 0.21 | 0.438 |
| (8) | X(3) | 8d | 0.34 | 0.485 | 0.41 |
| (9) | X(4) | 8d | 0.11 | 0.314 | 0.363 |
| (10) | X(5) | 8d | 0.119 | 0.523 | 0.127 |

Space Group: Pbcn

In addition, in Table 1, symbols in Site represent symmetry of the space group. Coordinates are values of 0 to 1 with respect to the lattice of x, y, and z. Moreover, $M^1$ and Ce are put in RE by the respective probabilities of their composition ratios, and Si and Al are put in M(1) to M(3) by the respective probabilities of their composition ratios, and N and O are put in X(1) to X(5) by the respective probabilities of their composition ratios. Whether the obtained material is a JEM phase or not can be identified by comparing X-ray diffraction data calculated by using the values in Table 1 with X-ray diffraction result obtained by measurement. In the case of using such an oxynitride crystal, covalent bond property of the crystal is strong and therefore, the crystal has excellent environment resistance and excellent temperature stability and, it becomes possible to highly efficiently emit a light mainly having a wavelength of 510 nm or less.

In such an oxynitride phosphor represented by a composition formula $M(1)_{1-j}M(2)_j Si_b Al_c O_d N_e$ (composition formula I) as described above, if a rate of content of the JEM phase is less than 50%, there is a trouble that emission efficiency of the oxynitride phosphor becomes significantly degraded. Moreover, it is preferable that the rate of content of the JEM phase is 70% or more, in order not to cause unnecessary absorption or emission of a crystal phase other than the JEM phase.

It is preferable that the first oxynitride phosphor of the present invention contains 50% or more of a JEM phase represented by a formula $M(1)_{1-j}M(2)_j Al(Si_{6-z}Al_z)N_{10-z}O_z$, as the JEM phase, and containing 70% or more is more preferable. In addition, in the above-described formula, the z is a real number complying with $0.1 \leq z \leq 3$. The JEM phase containing an alkaline-earth metal has not been conventionally found. However, as a result of detailed investigation by the present inventors, it has been found that even in crystals in which an alkaline-earth metal is contained, an oxynitride material containing a JEM phase as the main component exists, and emits a light highly efficiently as a phosphor. In the first oxynitride phosphor of the present invention, a large amount of the phosphor having a composition containing the JEM phase represented by the above-described formula can be obtained.

In addition, the rate of content of the JEM phase in the oxynitride phosphor can be measured as follows. First, the oxynitride phosphor is crushed into powders in a mortar and powder X-ray diffraction measurement by Cu—Kα ray is performed by, for example, using a powder X-ray diffraction apparatus (2200V type, manufactured by Rigaku Co., Ltd.). By using the result, by Liebert analysis calculation program (RIETAN-2000), an X-ray diffraction graphic simulation is performed and thereby, the respective maximum peak intensities are calculated with respect to peaks derived from the JEM phase and peaks derived from β-Sialon. From these values, the rate of content (%) of the JEM phase in the oxynitride phosphor can be calculated by the following formula.

Rate of Content (%) of JEM phase=100×(Maximum Peak Intensity of JEM phase)/(Maximum Peak Intensity of JEM phase+Maximum Peak Intensity of β-Sialon)

It is presupposed that a second oxynitride phosphor of the present invention is represented by a composition formula $M(1)_{1-a-j}M(2)_jCe_aSi_bAl_cO_dN_e$ (composition formula II). The second oxynitride phosphor has a composition containing Ce (cerium) as an essential component as well as the above-described composition of the first oxynitride phosphor of the present invention. The second oxynitride phosphor of the present invention characterized by having such a composition and containing 50% or more of a JEM phase has an advantage that particularly emission of blue to green blue can be obtained easily by absorption of the near ultraviolet region in the vicinity of 400 nm compared to the above-described first oxynitride phosphor of the present invention.

A composition ratio (concentration) of Ce in the composition formula II is a real number complying with $0.1 \leq a \leq 1$. In the case that the a representing a composition ratio of Ce in the second oxynitride phosphor of the present invention is less than 0.1, the absorption of the near ultraviolet region in the vicinity of 400 nm is particularly reduced. In addition, the a representing a composition ratio of Ce can be measured by the same method as described above with respect to the respective composition ratios j, b, c, d, and e.

In the second oxynitride phosphor of the present invention, M(1) in the composition formula II represents La, or a material in which La serves as a main component and in which at least one kind of chemical elements selected from a group composed of Pr, Nd, Sm, Eu, Gd, Tb, Dy, Ho, Er, Tm, Yb, and Lu serve(s) as accessory component(s) (this is different from the above-described first oxynitride phosphor of the present invention in the point that the group from which the accessory component(s) is/are selected does not contains Ce). Here, in the case that La serves as a main component and the accessory component(s) selected from the above-described group is contained, a preferable rate of content of the main component or the accessory component(s) is selected in the above-described range with respect to the first oxynitride phosphor of the present invention, respectively, by the same reason as described above.

Moreover, in the composition formula II representing the second oxynitride phosphor of the present invention, the M(2) is the same alkaline-earth metal as the above-described one with respect to the first oxynitride phosphor of the present invention, and is preferably any one of calcium, strontium, and barium. The composition ratio (concentration) j of the alkaline-earth metal(s) in the composition formula II is selected from the range of $0<j<1-a$, and even in the range, the preferable range is different according to the kind of the alkaline-earth metal and, this point will be specifically described later. In addition, the a in the above-described composition ration j of the alkaline-earth metal is the above-described composition ratio of Ce. Moreover, the composition ratio of M(1) in the composition formula II is selected so as to be 1-a-j according to the composition ratio j of the alkali-earth metal and the composition ratio a of Ce.

In the composition formula II representing the second oxynitride phosphor of the present invention, the composition ratio(s) of the component(s) except for the above-described components is/are the same as the above-described components with respect to the first oxynitride phosphor of the present invention. That is, in the composition formula II, the b representing a composition ratio of Si is a real number complying with $b=(6-z) \times f$, the c representing a composition ratio of Al is a real number complying with $c=(1+z) \times g$, the d representing a composition ratio of O is a real number complying with $d=z \times h$, and the e representing a composition ratio of N is a real number complying with $e=(10-z) \times i$. Moreover, the z is a real number complying with $0.1 \leq z \leq 3$, the f is a real number complying with $0.7 \leq f \leq 1.3$, the g is a real number complying with $0.7 \leq g \leq 3$, the h is a real number complying with $0.7 \leq h \leq 3$, and the i is a real number complying with $0.7 \leq i \leq 1.3$. In the same method as the above-described first oxynitride phosphor of the present invention, in the second oxynitride phosphor of the present invention, it is preferable that also in the composition formula II, the d representing a composition ratio of O is a real number complying with $1<d \leq 2$ and the e representing a composition ratio of N is a real number complying with $8<e<9$.

The second oxynitride phosphor of the present invention is characterized by being represented by the above-described composition formula $M(1)_{1-a-j}M(2)_jCe_aSi_bAl_cO_dN_e$ (composition formula II) and containing 50% or more of a JEM phase, or preferably 70% or more. It is preferable that the second oxynitride phosphor of the present invention contains 50% or more of a JEM phase represented by a formula $M(1)_{1-a-j}M(2)_jCe_aAl(Si_{6-z}Al_z)N_{10-z}O_z$, and containing 70% or more is more preferable. In addition, in the above-described formula, the z is a real number complying with $0.1 \leq z \leq 3$. In the second oxynitride phosphor of the present invention, a large amount of the phosphor having a composition containing the JEM phase represented by the above-described formula can be obtained.

The methods for producing the above-described first oxynitride phosphor and the second oxynitride phosphor of the present invention are not particularly limited, and the phosphors can be suitably produced by applying a conventionally known method for producing an oxynitride phosphor so that each of the chemical elements appropriately becomes a raw material having such proportions (weight %) as described above. For example, first, desired powders of components containing the respective chemical elements (such as, silicon nitride ($Si_3N_4$), aluminum nitride (AlN), calcium carbonate ($CaCO_3$), strontium carbonate ($SrCO_3$), barium carbonate ($BaCO_3$), lanthanum oxide ($La_2O_3$), and cerium oxide ($CeO_2$)) are mixed so as to have a desired proportion. The obtained mixed powder is put in a crucible made of boron nitride and then, this crucible is introduced in an electric furnace having a graphite resistance-heating system. The inside of the electric furnace is exhausted by a vacuum pump and then, the temperature is raised from the room temperature (for example, to 800° C.) and then, a nitrogen gas of high purity (for example, purity of 99.999% by volume) is introduced and the pressure is held constant (for example, 1 MPa). Furthermore, the heating is performed to a higher temperature at a constant rate (for example, at a rate of approximately 500° C./hr to 1700° C.) and then, the temperature is held for a constant time (for example, 2 hours), and thereby, firing is performed. By such a method, the above-described first oxynitride phosphor and the above-described second oxynitride phosphor of the invention that have desired compositions after the firing can be suitably produced.

Preferably, the oxynitride phosphor of the present invention has an emission peak wavelength of 450 to 510 nm even if the phosphor is either of the above-described first or second oxynitride phosphor. The oxynitride phosphor of the present invention has an emission peak wavelength in a wavelength region within the above-described range and therefore, can be used as a highly efficient phosphor emitting a light of blue to blue green.

In the second oxynitride phosphor of the present invention, it is preferable that the alkaline-earth metal(s) contain(s) any one of calcium (Ca), strontium (Sr), and barium (Ba) as described above.

In the case that the alkaline-earth metal in the second oxynitride phosphor of the present invention is calcium, it is more preferable that a composition ratio j of the calcium (Ca composition ratio j) is $0<j<0.75$. This is because if the Ca composition ratio j is 0.75 or more, crystallinity of the JEM crystal is degraded and the emission efficiency is prone to lower. Moreover, in order that Ce that is an emission ion gets stably in a JEM site, it is particularly preferable that the Ca composition ratio j is $0<j<(1-a)\times 0.75$. In addition, the a is a composition ratio of Ce.

Here, FIG. 1 shows excitation spectra in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents intensity, and the horizontal axis represents wavelength (nm). In FIG. 1, curve A represents an excitation spectrum of $La_{0.375}Ca_{0.125}Ce_{0.5}Si_{5.125}Al_{1.875}O_{1.438}N_{8.708}$ (rate of content of JEM phase: 95%) (Example 2 to be described later), curve B represents an excitation spectrum of $La_{0.25}Ca_{0.25}Ce_{0.5}Si_{5.25}Al_{1.75}O_{1.375}N_{8.75}$ (rate of content of JEM phase: 93%) (Example 4 to be described later), curve C represents an excitation spectrum of $La_{0.5}Ce_{0.5}Si_{5.0}Al_{2.0}O_{1.5}N_{2.0}$ (rate of content of JEM phase: 95%) (Comparative Example I to be described later), and curve D represents an excitation spectrum of $La_{0.125}Ca_{0.375}Ce_{0.5}Si_{5.375}Al_{1.625}O_{1.313}N_{8.792}$ (rate of content of JEM phase: 95%) (Example 6 to be described later). In addition, the excitation spectra shown in FIG. 1 show results measured by using a spectrophotometer (F4500 type, manufactured by HITACHI Co., Ltd.)

From FIG. 1, it is found that in the case of changing the Ca composition ratio j in the oxynitride phosphor, the excitation spectrum changes largely. That is, in the case that the Ca composition ratio j is 0 (curve C), the excitation peak wavelength is approximately 377 nm. However, as the Ca composition ratio j is set to be larger, the spectrum moves to a longer wavelength side (curves A, B, and C). This phenomenon is mainly originated from a smaller ion radius of Ca than that of La. This phenomenon occurs because atomic distance or symmetry between Ce that is an emission ion and its periphery are changed along with increase of the Ca composition ratio j and, as the atomic distance becomes shorter, the covalent bond property increases and the absorption spectrum comes to have a longer wavelength. As a result, emission by excitation at a wavelength of 390 to 420 nm increases.

Figure 2:
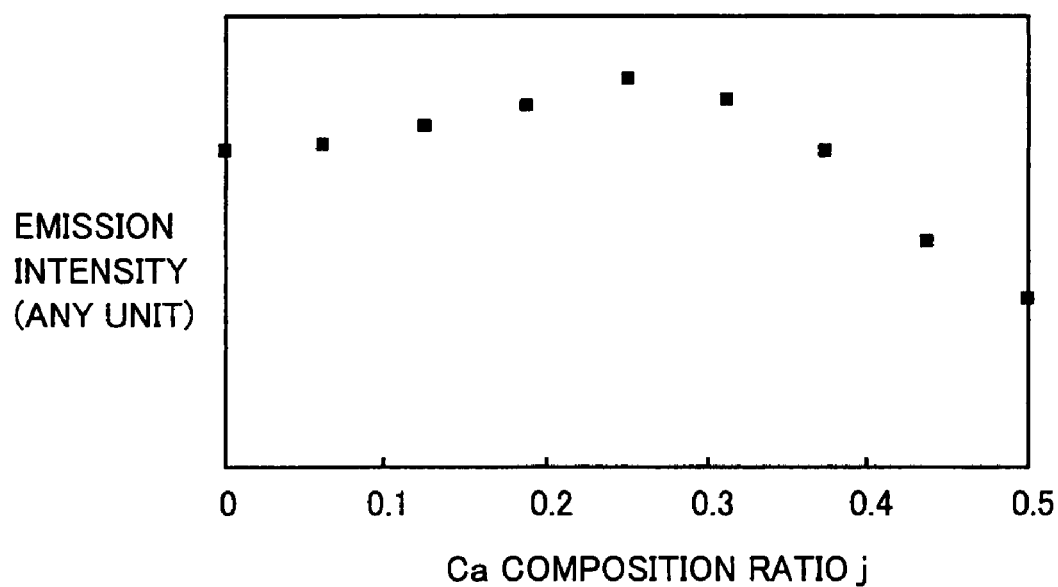
FIG. 2 is a graph showing dependency of emission intensity in excitation by a wavelength of 405 nm with respect to a Ca composition ratio j in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents Ca composition ratio j.

Moreover, FIG. 2 is a graph showing dependency of emission intensity in excitation by a wavelength of 405 nm with respect to a Ca composition ratio j in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents Ca composition ratio j. From FIG. 2, it is found that as the Ca composition ratio j increases from 0, the emission intensity increases and that when the Ca composition ratio exceeds j=0.25, the intensity shifts to decrease. However, when the Ca composition ratio j<0.375, the phosphor shows higher emission intensity than that of the oxynitride phosphor (Ca composition ratio j=0) to which an alkaline-earth metal is not added. Moreover, it is found that in the region that the Ca composition j is high, the emission efficiency lowers due to trade-off with lengthening of the wavelength of the spectrum because the crystallinity is degraded.

Figure 3:
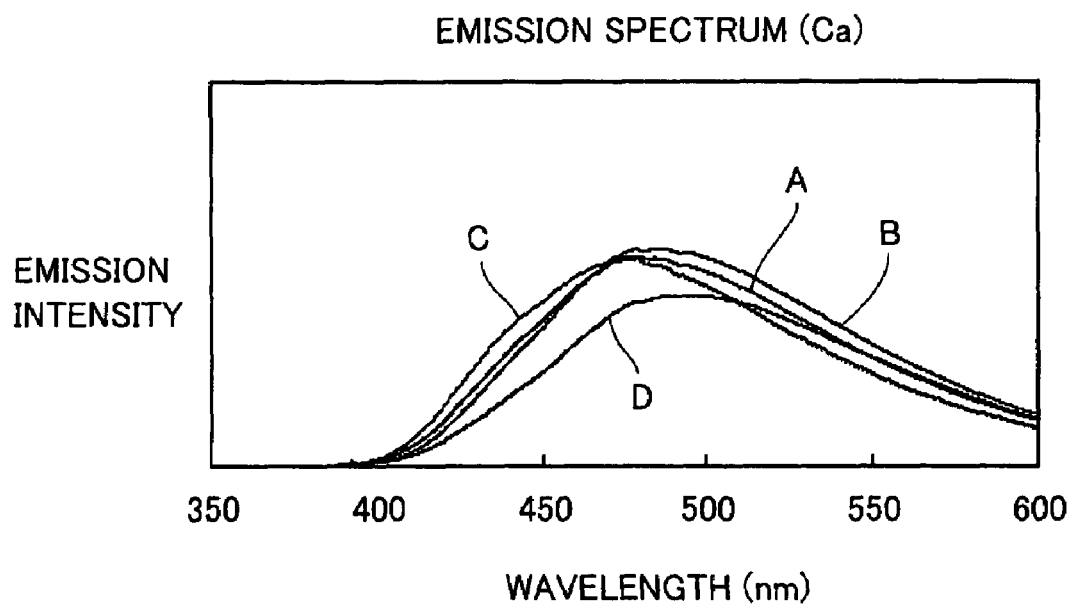
FIG. 3 is emission spectrums in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents wavelength (nm).

Moreover, FIG. 3 shows emission spectra in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents wavelength (nm). Curves A to D shown in FIG. 3 correspond to the respective oxynitride phosphors represented by curves A to D in FIG. 1. In the case that the alkaline-earth metal that is M(2) is calcium, the emission spectrum comes to have a longer wavelength along with increase of the Ca composition ratio j. This phenomenon is also mainly originated from a smaller ion radius of Ca than that of La. This property is suitable for tuning the spectrums of a white light.

In the case that the alkaline-earth metal in the second oxynitride phosphor of the present invention is strontium, it is more preferable that a composition ratio j of the strontium (Sr composition ratio j) is $0<j<0.85$. This is because if the Sr composition ratio j is 0.85 or more, crystallinity of the JEM phase is degraded and the emission efficiency is prone to lower. Moreover, in order that Ce that is an emission ion gets stably in a JEM site, it is particularly preferable that the Sr composition ratio j is $0<j<(1-a)\times 0.85$. In addition, the a is a composition ratio of Ce.

Figure 4:
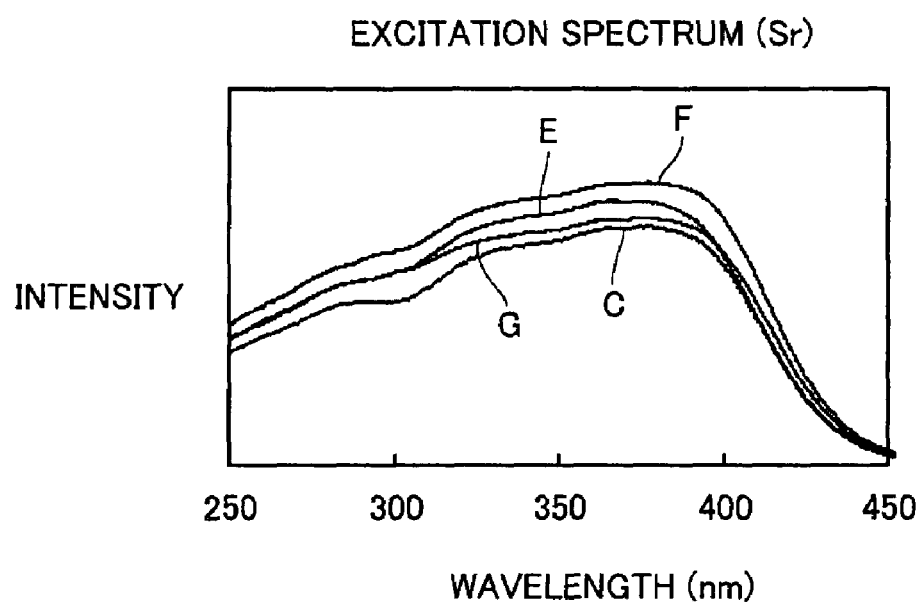
FIG. 4 is excitation spectrums in the case that the alkaline-earth metal that is M(2) is strontium in the oxynitride phosphor represented by a composition formula $M(1)_{1-a-j}M(2)_j Ce_a Si_b Al_c O_d N_e$ (composition formula II), and the longitudinal axis represents intensity, and the horizontal axis represents wavelength (nm).

Here, FIG. 4 shows excitation spectra in the case that the alkaline-earth metal that is M(2) is strontium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents wavelength (nm). In FIG. 4, curve E represents an excitation spectrum of $La_{0.375}Sr_{0.125}Ce_{0.5}Si_{5.125}Al_{1.875}O_{1.438}N_{8.708}$ (rate of content of JEM phase: 94%) (Example 9 to be described later), curve F represents an excitation spectrum of $La_{0.25}Sr_{0.25}Ce_{0.5}Si_{5.25}Al_{1.75}O_{1.375}N_{8.75}$ (rate of content of JEM phase: 95%) (Example 11 to be described later), curve G represents an excitation spectrum of $La_{0.125}Sr_{0.375}Ce_{0.5}Si_{5.375}Al_{1.625}O_{1.313}N_{8.792}$ (rate of content of JEM phase: 94%) (Example 13 to be described later), and curve C represents an excitation spectrum of $La_{0.5}Ce_{0.5}Si_{5.0}Al_{2.0}O_{1.5}N_{2.0}$ (rate of content of JEM phase: 95%) (Comparative Example 1 to be described later). In addition, the excitation spectra shown in FIG. 4 show results measured by the same method as the above-described method for FIG. 1.

Figure 5:
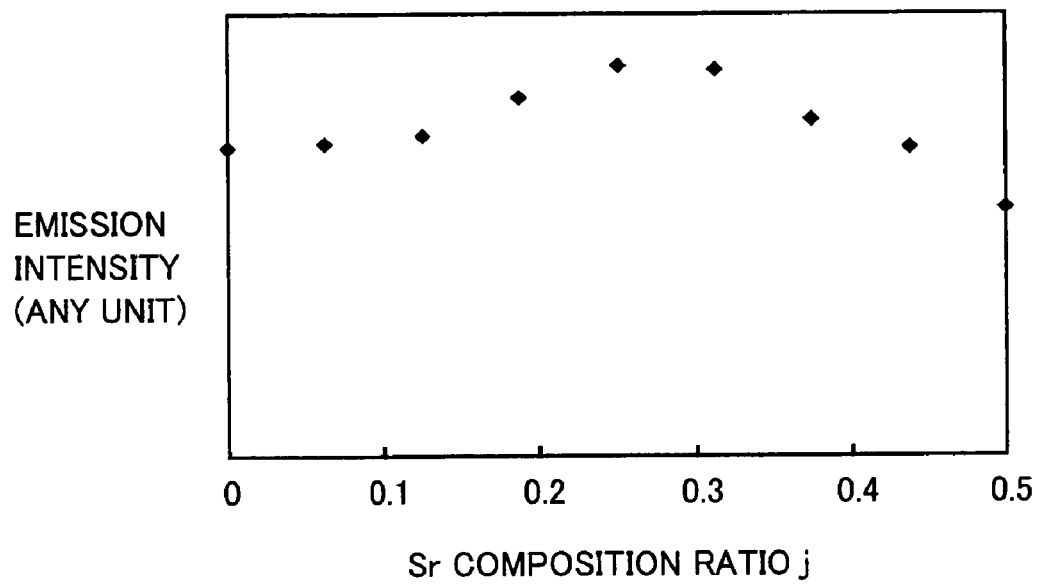
FIG. 5 is a graph showing dependency of emission intensity in excitation by a wavelength of 405 nm with respect to a Sr composition ratio j in the case that the alkaline-earth metal that is M(2) is strontium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents Sr composition ratio j.

Moreover, FIG. 5 is a graph showing dependency of emission intensity in excitation by a wavelength of 405 nm with respect to a Sr composition ratio j in the case that the alkaline-earth metal that is M(2) is strontium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents Sr composition ratio j. As shown in FIG. 5, compared to the case that the Sr composition ratio j is 0, the emission intensity increases until the Sr composition ratio j=0.25 as the Sr composition ratio j is increased. This phenomenon is originated mainly from difference between La and Sr in ion electrification. This phenomenon occurs because of change of the charge distribution of the periphery of Ce that is an emission ion. From FIG. 5, it is found that as the Sr composition ratio j increases from 0, the emission intensity increases and that when the Sr composition ratio exceeds j=0.25, the intensity shifts to decrease. However, when the Sr composition ratio j<0.4375, the phosphor shows higher emission intensity than that of the oxynitride phosphor (Sr composition ratio j=0) to which an alkaline-earth metal is not added. Moreover, in the region that the Sr composition ratio j is high, the emission efficiency lowers because the crystallinity is degraded.

Figure 6:
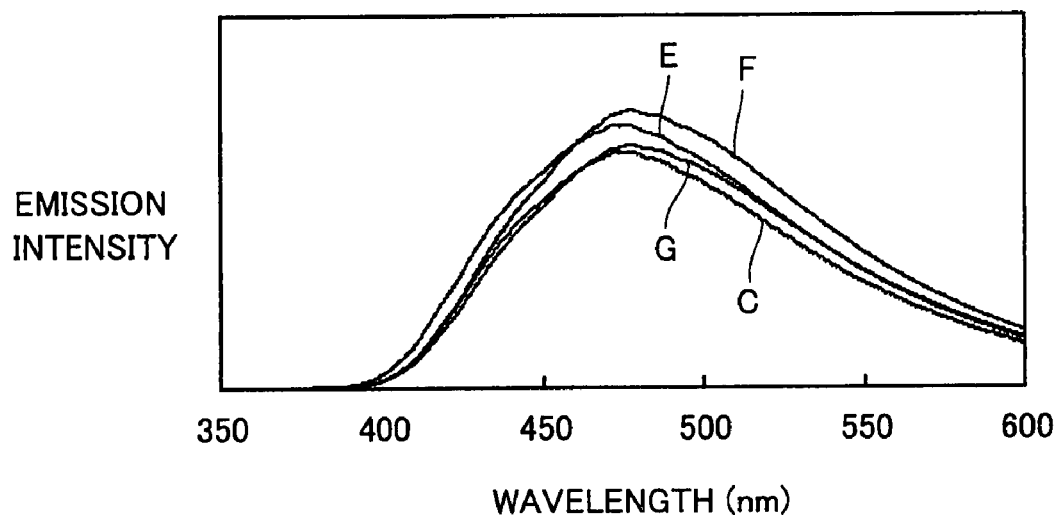
FIG. 6 is emission spectrums in the case that the alkaline-earth metal that is M(2) is strontium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents wavelength (nm).

FIG. 6 shows emission spectrums in the case that the alkaline-earth metal that is M(2) is strontium in the oxynitride phosphor represented by a composition formula $M(1)_{1-a-j}M(2)_j Ce_a Si_b Al_c O_d N_e$, and the longitudinal axis represents emission intensity, and the horizontal axis represents wavelength (nm). Curves E to G, C shown in FIG. 6 correspond to the respective oxynitride phosphors represented by curves E to G, C in FIG. 4. In the case that the alkaline-earth metal that is M(2) is strontium, the emission spectrum is stable at approximately 480 nm. The phenomenon that the oxynitride phosphor (Example 9 to be described layer) represented by curve E has a slightly shorter wavelength is originated from a larger ion radius of Sr than that of La.

Moreover, in the case that the alkaline-earth metal in the second oxynitride phosphor of the present invention is barium, it is more preferable that a composition ratio j of the barium (Ba composition ratio j) is 0<j<0.5. This is because if the Ba composition ratio j is 0.5 or more, crystallinity of the JEM phase is degraded and the emission efficiency is prone to lower. Moreover, in order that Ce that is an emission ion gets stably in a JEM site, it is particularly preferable that the Ba composition ratio j is 0<j<(1−a)×0.5. In addition, the a is a composition ratio of Ce.

Figure 7:
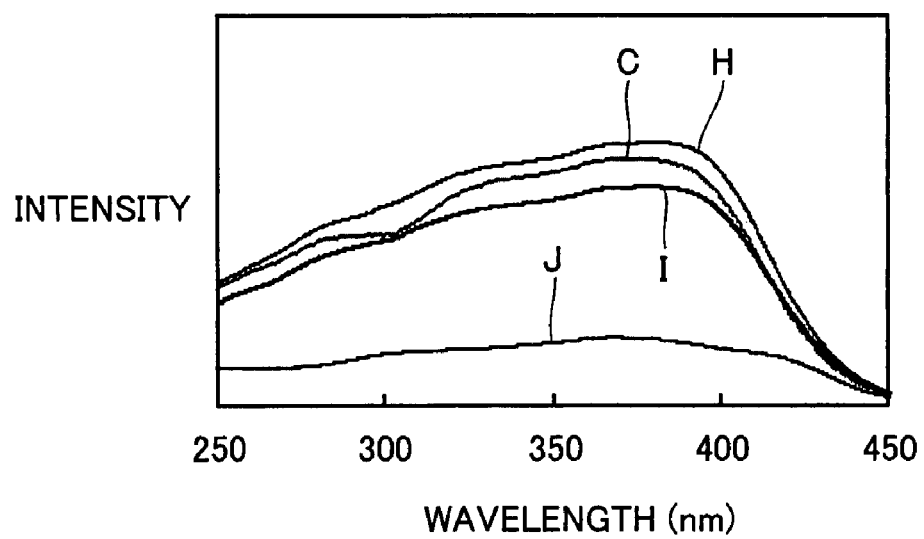
FIG. 7 is excitation spectrums in the case that the alkaline-earth metal that is M(2) is barium in the oxynitride phosphor represented by a composition formula $M(1)_{1-a-j}M(2)_j Ce_a Si_b Al_c O_d N_e$ (composition formula II), and the longitudinal axis represents intensity, and the horizontal axis represents wavelength (nm).

Here, FIG. 7 shows excitation spectrums in the case that the alkaline-earth metal that is M(2) is barium in the oxynitride phosphor represented by a composition formula $M(1)_{1-a-j}M(2)_j Ce_a Si_b Al_c O_d N_e$, and the longitudinal axis represents emission intensity, and the horizontal axis represents wavelength (nm). In FIG. 7, curve H represents an excitation spectrum of $La_{0.375}Ba_{0.125}Ce_{0.5}Si_{5.125}Al_{1.875}O_{1.438}N_{8.708}$ (rate of content of JEM phase: 91%) (Example 18 to be described later), curve I represents an excitation spectrum of $La_{0.25}Ba_{0.25}Ce_{0.5}Si_{5.25}Al_{1.75}O_{1.375}N_{8.75}$ (rate of content of JEM phase: 89%) (Example 20 to be described later), curve J represents an excitation spectrum of $La_{0.125}Ba_{0.375}Ce_{0.5}Si_{5.375}Al_{1.625}O_{1.313}N_{8.792}$ (rate of content of JEM phase: 85%) (Example 22 to be described later), and curve C represents an excitation spectrum of $La_{0.5}Ce_{0.5}Si_{5.0}Al_{2.0}O_{1.5}N_{2.0}$ (rate of content of JEM phase: 95%) (Comparative Example 1 to be described later). In addition, the excitation spectrums shown in FIG. 7 show results measured by the same method as the above-described method for FIG. 1.

Figure 8:
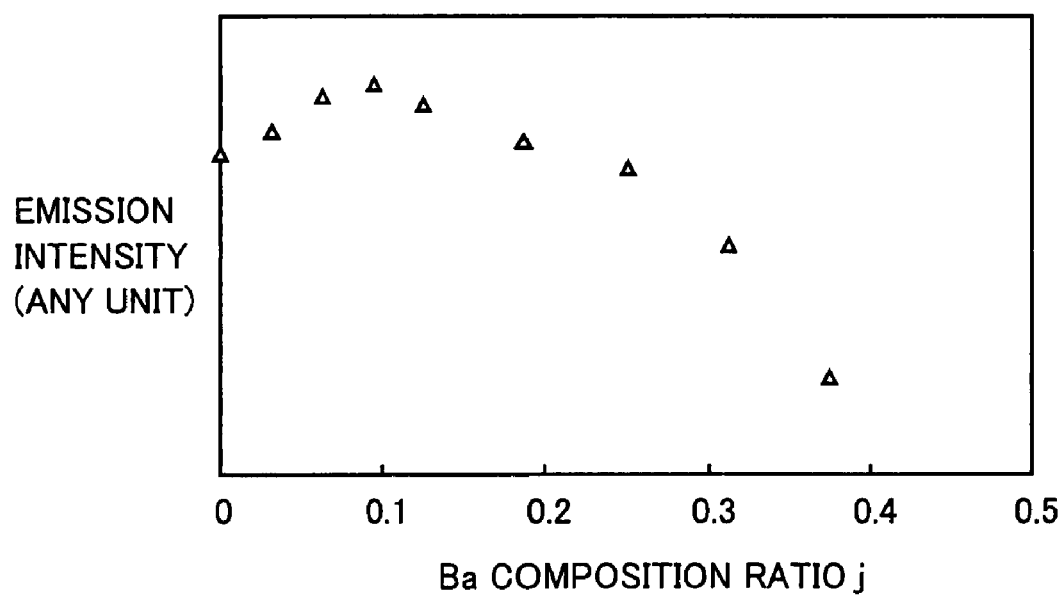
FIG. 8 is a graph showing dependency of emission intensity in excitation by a wavelength of 405 nm with respect to a Ba composition ratio j in the case that the alkaline-earth metal that is M(2) is barium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents Ba composition ratio j.

Moreover, FIG. 8 is a graph showing dependency of emission intensity in excitation by a wavelength of 405 nm with respect to a Ba composition ratio j in the case that the alkaline-earth metal that is M(2) is barium in the oxynitride phosphor represented by a composition formula $M(1)_{1-a-j}M(2)_j Ce_a Si_b Al_c O_d N_e$, and the longitudinal axis represents emission intensity, and the horizontal axis represents Ba composition ratio j. As shown in FIG. 8, compared to the case that the Ba composition j is 0, the emission intensity increases until the Ba composition ratio j=0.1 as the Ba composition ratio j is increased. This phenomenon is originated mainly from difference between La and Ba in ion electrification. This phenomenon occurs because of change of the charge distribution of the periphery of Ce that is an emission ion. From FIG. 8, it is found that as the Ba composition ratio j increases from 0, the emission intensity increases and that when the Ba composition ratio exceeds j=0.1, the intensity shifts to decrease. However, when the Ba composition ratio j≦0.1875, the phosphor shows higher emission intensity than that of the oxynitride phosphor (Ba composition ratio j=0) to which an alkaline-earth metal is not added. Moreover, in the region that the Ba composition ratio j is high, the emission efficiency lowers because the crystallinity is degraded.

Figure 9:
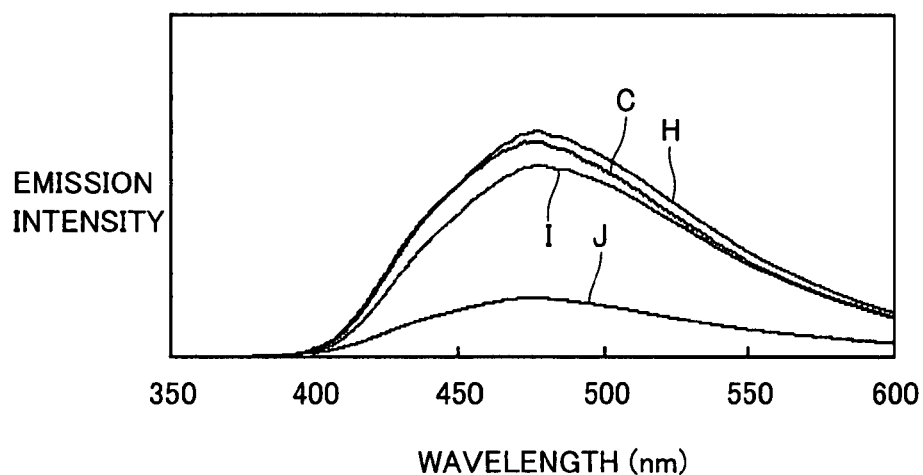
FIG. 9 is emission spectrums in the case that the alkaline-earth metal that is M(2) is barium in the oxynitride phosphor represented by a composition formula $M(1)_{1-a-j}M(2)_j Ce_a Si_b Al_c O_d N_e$ (composition formula II), and the longitudinal axis represents emission intensity, and the horizontal axis represents wavelength (nm).

FIG. 9 shows emission spectrums in the case that the alkaline-earth metal that is M(2) is barium in the oxynitride phosphor represented by a composition formula $M(1)_{1-a-j}M(2)_j Ce_a Si_b Al_c O_d N_e$, and the longitudinal axis represents emission intensity, and the horizontal axis represents wavelength (nm). Curves H to J, C shown in FIG. 9 correspond to the respective oxynitride phosphors represented by curves H to J, C shown in FIG. 7. In the case that the alkaline-earth metal that is M(2) is barium, the emission spectrum is stable at approximately 480 nm.

Figure 10:
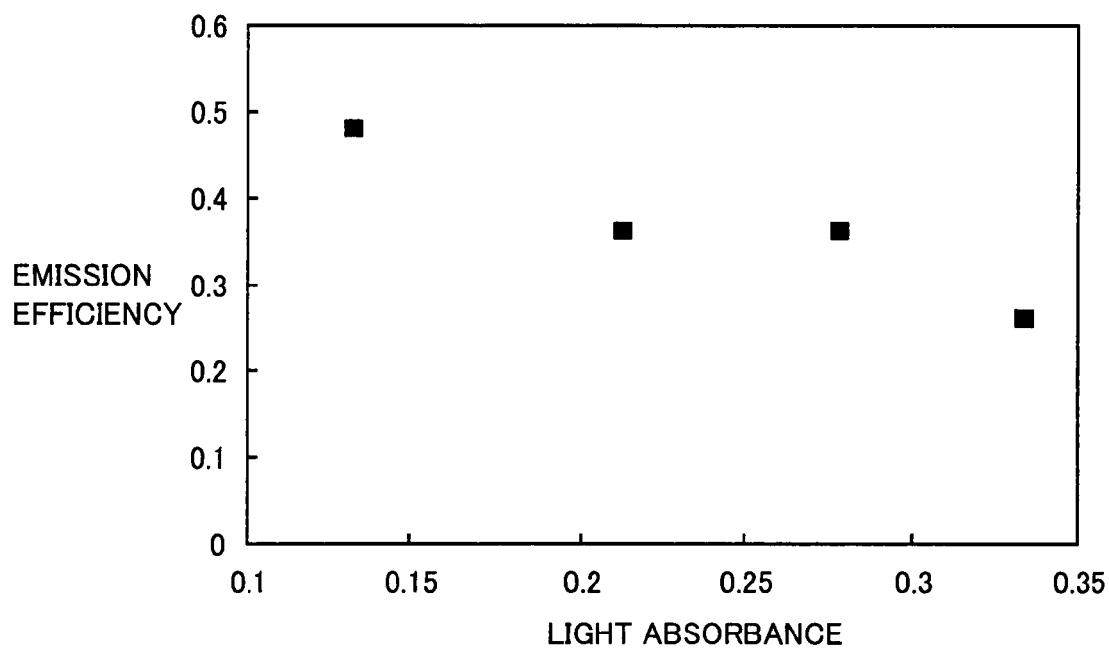
FIG. 10 is a graph showing a relation of light absorbance in a wavelength of 590 nm and emission efficiency (quantum efficiency×absorbance of excitation light) in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission efficiency, and the horizontal axis represents light absorbance.

Moreover, it is desirable that absorbance of a light having a wavelength of 510 to 800 nm in the oxynitride phosphor of the present invention is 30% or less whether the phosphor is the above-described first or second oxynitride phosphor of the present invention. The present inventors have thoroughly investigated the relation between emission efficiency and light absorbance and, as a result, have found that in the oxynitride phosphor of the present invention, the emission efficiency becomes large when the light absorbance is small. FIG. 10 is a graph showing a relation of light absorbance in a wavelength of 590 nm and emission efficiency (quantum efficiency×absorbance of excitation light) in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission efficiency, and the horizontal axis represents light absorbance.

From FIG. 10, it is found that the oxynitride phosphor of the present invention has higher emission efficiency as the light absorbance in a wavelength of 590 nm is lower. The present inventors have thought that for providing higher emission efficiency than that of competitive phosphors with the oxynitride phosphor of the present invention, the emission efficiency of 0.3 or more, or more preferably, 0.4 or more is required. From this matter, as described above, it is thought that in the oxynitride phosphor of the present invention, it is preferable that absorbance of a light having a wavelength of 510 to 800 nm including a wavelength of 590 nm (yellow) is 30% or less, and 20% or less is more preferable, and 15% or less is particularly preferable. It is supposed that this is because when the light absorbance in a long wavelength region is small, a proportion of a JEM phase is large and a proportion of a glass phase is small. That is, in the case that a rate of content of JEM phase that is crystal phase becomes lower, not only the JEM phase having high emission efficiency decreases, but also the glass phase, that is an amorphous phase formed as a by-product when phosphor crystal such as JEM phase is fired, increases. It is thought that because the light absorbance of the glass phase is high, the light absorbance of the oxynitride phosphor becomes high as a result.

Figure 11:
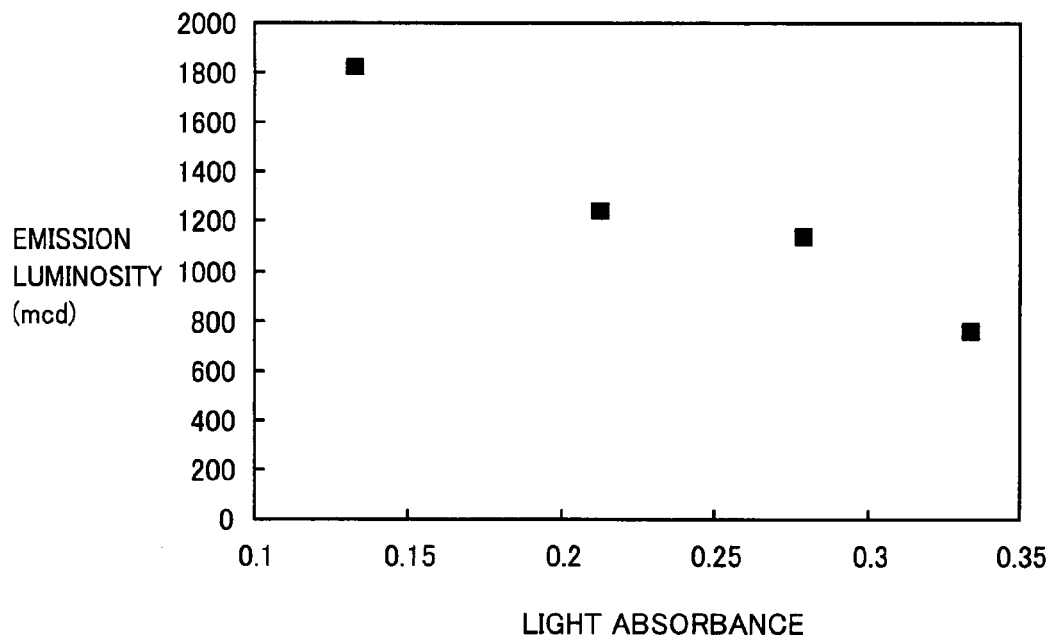
FIG. 11 is a graph showing a relation of light absorbance and emission intensity in the case that the alkaline-earth metal that is M(2) is calcium in the oxynitride phosphor represented by a composition formula $M(1)_{1-a-j}M(2)_j Ce_a Si_b Al_c O_d N_e$ (composition formula II), and the longitudinal axis represents emission luminosity (mcd), and the horizontal axis represents light-absorbance.

Moreover, the present inventors found that for improving emission efficiency for the entirety of the light emitting device, it is important that as properties of a phosphor that are suitable for the case of using a plurality of phosphors, not only the emission efficiency is excellent but also light absorbance in the other wavelengths is small. FIG. 11 is a graph showing a relation of light absorbance and emission intensity in the case that the alkaline-earth metal that is M(2) is calcium in the oxynitride phosphor represented by a composition formula $M(1)_{1-a-j}M(2)_{j}Ce_{a}Si_{b}Al_{c}O_{d}N_{e}$ (composition formula II), and the longitudinal axis represents emission luminosity (mcd), and the horizontal axis represents light-absorbance. When the light absorbance in a visible light region becomes higher, as well as the above-described phenomenon of degradation of the emission efficiency, the phenomenon of absorption of emission from a phosphor having a long wavelength such as green, yellow, and red that can be utilized being combined with a blue phosphor is caused. Such absorption of another wavelength causes degradation of emission intensity in the entirety of the device using a plurality of phosphors to be described later. Therefore, as shown in FIG. 11, luminosity of the light emitting device indicates stronger dependency with respect to light absorbance.

Conventionally, for example, as shown in Japanese Patent Laying-Open No. 2004-331934, there is a description that it is preferable that reflectance (having a negative correlation with light absorbance) is high in a shorter wavelength than that of fluorescence emitted by the phosphor. However, because a phosphor generally absorbs a shorter wavelength than a wavelength of fluorescence and emits a light, it is obvious that the light absorption exists in a region of shorter wavelength than the wavelength of fluorescence. On the other hand, the present inventors found that in a phosphor of blue to blue green, particularly, the oxynitride phosphor of the present invention containing 50% or more of a JEM phase, when the phosphor is used together with another phosphor, particularly when the phosphor is used as a light emitting device, it is actually important that long wavelength light absorbance is small in lights having longer wavelengths than that of fluorescence from the phosphor, specifically, lights of green to yellow or red.

In addition, the present inventors estimates that a JEM phase phosphor having small absorption in such a visible light region as described above, namely, having a low rate of content of a glass phase can be obtained mainly by preventing nitrogen from dropping out of the JEM phase that is a crystal phase in firing of the phosphor. Accordingly, as a firing condition of the JEM phase phosphor, a nitrogen pressure of 0.5 MPa or more is desirable, and 1 MPa or more is more desirable. Moreover, only for improving crystallinity of the JEM phase, it is desirable to perform firing at a high temperature for a long time. However, in this case, the present inventors also found that if the temperature is too high or if the time for holding the temperature to be high is too long, the proportion of glass phase increases. From the above, as the firing temperature, a temperature of 1600 to 1900° C. is desirable, and a temperature of 1700 to 1800° C. is more desirable. Also, as the firing time, 50 hours or less is desirable and 30 hours or less is more desirable. In addition, with respect to the point at which the oxynitride phosphor obtained by the firing becomes JEM phase or glass phase, activation of a rare earth is difficult to have an effect on the phosphor (because an amount of the rare earth is extremely small and the rare earth gets into the same lattice position) and therefore, this production condition is applicable to the entirety of phosphors having JEM phases with different amounts of activation of a rare earth such as La, Ce or alkaline-earth metal substituted therefor.

Moreover, as described above, the present invention provides a light emitting device using the oxynitride phosphor of the present invention that has excellent emission characteristics and that is suitable for being combined with another phosphor. That is, the light emitting device of the present invention is characterized by having a semiconductor light emitting element emitting an excited light, a first phosphor that is the above-described oxynitride phosphor of the present invention that absorbs the excited light and emits a fluorescence, and a kind or a plurality of kinds of second phosphor(s) that absorb(s) the excited light and emit(s) a fluorescence having a longer wavelength than the fluorescence emitted by the first phosphor. Such a light emitting device of the present invention has excellent color rendering properties and particularly, white-based colors (such as white, daytime white, and light bulb color) that are suitable for illumination can be obtained.

For example, in order to realize favorable color-rendering properties in a light emitting device using a semiconductor light emitting element emitting a light of ultraviolet to purple as an exciting light source, the phosphor(s) emitting lights in a balanced manner over a wide wavelength region of visible lights is/are required. Therefore, a plurality of phosphors are mixed and thereby, high color-rendering properties can be obtained. However, there is a problem that if kinds of mixed phosphors are increased, the emission intensity to be obtained decreases in its entirety due to reabsorption of the fluorescence. Accordingly, in the light emitting device of the present invention, by using a large emission spectrum full width at half maximum in the oxynitride phosphor of the present invention having excellent emission characteristics in blue to blue green, phosphors (particularly, yellow phosphors) complementing wavelengths to each other in the visible region are combined and thereby, the color-rendering properties can be very high and natural emission can be performed. Moreover, by the light emitting device of the present invention, more excellent color-rendering properties can be realized by mixing another phosphor, when compared to the case that the oxynitride phosphor of the present invention is separately used.

Figure 12:
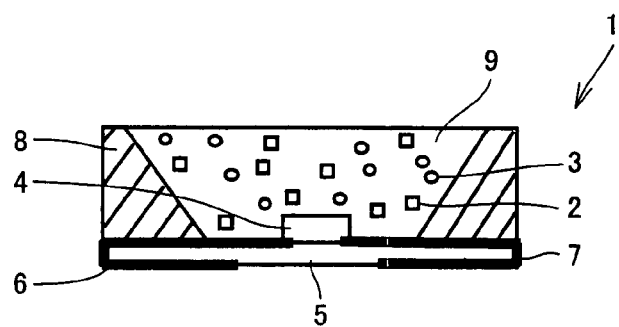
FIG. 12 is a section view that schematically shows a light emitting device 1 of a preferable first example of the present invention.

FIG. 12 is a section view that schematically shows a light emitting device 1 of a preferable first example of the present invention. In FIG. 12, there is shown light emitting device 1 in the case of having a first phosphor 2 that is the oxynitride phosphor of the present invention and one kind of a second phosphor 3. Light emitting device 1 of an example shown in FIG. 12 has a substrate 5, electrodes 6, 7 formed on a surface of substrate 5, and a semiconductor light emitting element 4 connected electrically to electrodes 6, 7. In addition, electrodes 6, 7 are sterically pulled around from an upper surface of substrate 5 to a lower surface of substrate 5, which is a mounting surface (not shown). Moreover, on substrate 5, a surface is formed in a mirror form in order to efficiently take out a light, and a frame 8 providing such a mortar-like space as spreading to the periphery with centering semiconductor light emitting element 4 is provided, and first phosphor 2 and second phosphor 3 are sealed in a sealing member 9 so as to be dispersed approximately uniformly in the space provided by semiconductor light emitting device 4, substrate 5, and frame 8.

In light emitting device 1 of the present invention, it is preferable that first phosphor 2 that is the above-described oxynitride phosphor of the present invention has the emission peak wavelength of 450 to 510 nm, as described above. First phosphor 2 that can highly efficiently emit a light of blue to blue green is preferable.

Moreover, in light emitting device 1 of the present invention, it is preferable that first phosphor 2 has an emission spectrum full width at half maximum of 80 nm or more, and 100 nm or more is more preferable. This is because in the case that first phosphor 2 has the emission spectrum full width at half maximum of less than 80 nm, it is in danger of becoming difficult to flatten spectrum in a blue region. In addition, the emission spectrum full width at half maximum of first phosphor 2 indicates, for example, a value measured by using a spectrum measurement apparatus (MCPD7000, manufactured by Otsuka Electronics Co., Ltd.).

In light emitting device 1 of the present invention, first phosphor 2 has a chromaticity coordinate x of 0.05 to 0.25, and a chromaticity coordinate y of 0.02 to 0.38. By using such first phosphor 2 having the chromaticity coordinates x and y in such a range, emission component in a blue region can be obtained. In addition, the chromaticity coordinates x and y of first phosphor 2 indicates, for example, values measured by using a spectrum measurement apparatus (MCPD7000, manufactured by Otsuka Electronics Co., Ltd.).

In light emitting device 1 of the present invention, it is preferable that second phosphor 3 has an emission peak wavelength of 565 to 605 nm. In the case that the emission peak wavelength of second phosphor 3 is less than 565 nm or more than 605 nm, a yellow emission component that is a complementary color component of emission of blue phosphor is not prone to be obtained. In addition, in such a case of using a plurality of kinds of second phosphors as light emitting devices 11, 21 of the present invention that are examples shown in FIGS. 13, 14 to be described later, the main one kind of emission peak wavelength may be in the above-described range. The above-described "main one kind" refers to a phosphor having a stronger fluorescent intensity determined by its amount and its emission efficiency than that (those) of the other phosphor(s) when a plurality of kinds of phosphors are used.

Moreover, in light emitting device 1 of the present invention, it is preferable that second phosphor 3 has an emission spectrum full width at half maximum of 80 nm or more, and 90 nm or more is more preferable. This is because in the case that second phosphor 3 has the emission spectrum full width at half maximum of less than 80 nm, it is prone to become difficult to flatten spectrum in a yellow region. In addition, the emission spectrum full width at half maximum of second phosphor 3 can be measured by the same method as described above for first phosphor 2. In such a case of using a plurality of kinds of second phosphors as light emitting devices 11, 21 of the present invention that are examples shown in FIGS. 13, 14 to be described later, the main one kind of emission spectrum full width at half maximum may be in the above-described range.

As second phosphor 3 in light emitting device 1 of the present invention, an oxynitride phosphor or a nitride phosphor is preferably used. Among them, as an oxynitride phosphor that is suitable for second phosphor 3, an Eu-activated α-Sialon phosphor or an Eu-activated β-Sialon phosphor is particularly preferably used.

The Eu-activated α-Sialon phosphor specifically includes yellow phosphors represented by $(Ca_{1-x}Eu_x)_{m/2}Si_{12-m-n}Al_{m+n}O_nN_{15-n}$ (0<x<1, 0.5≦m≦3, m is nearly equal to 2n). Among them, a yellow phosphor of $Ca_{0.93}Eu_{0.07}Si_9Al_3ON_{15}$ has preferable characteristics that the emission peak wavelength is 590 nm and that the emission spectrum full width at half maximum is approximately 90 nm or more. Moreover, a yellow phosphor of $(Ca_{0.93}Eu_{0.07})_{0.25}Si_{11.25}Al_{0.75}ON_{15.75}$ has preferable characteristics that the emission peak wavelength is 580 nm and that the emission spectrum full width at half maximum is approximately 90 nm or more. Either of these yellow phosphors has a strong peak of an excitation spectrum (fluorescent intensity distribution when wavelength of excited light is changed) in an excited light region (near-ultraviolet region) of ultraviolet to purple. Such an Eu-activated α-Sialon phosphor can be produced by, for example, first mixing powders of silicon nitride, aluminum nitride, calcium carbonate, and europium oxide and then, putting the powders in a crucible made of boron nitride and reacting the powders in nitrogen under 1 MPa at 1800° C. for 10 hours and then, grinding them.

Moreover, the Eu-activated β-Sialon phosphor specifically includes a green phosphor of a composition formula $Eu_{0.003}Si_{0.414}Al_{0.013}O_{0.005}N_{0.56528}$ that is described in Naoto Hirosaki, Rong-Jun Xie, Koji Kimoto, Takashi Sekiguchi, Yoshinobu Yamamoto, Takayuki Suehiro, and Mamoru Mitomo, "Characterization and properties of green-emitting β-SiALON:$Eu^{2+}$ powder phosphors for white light emitting diodes", Applied Physics Letters 86, 211905 (2005). The green phosphor indicates strong emission of emission peak wavelength of approximately 540 nm by an excited light of ultraviolet to purple and has a preferable characteristic that the emission spectrum full width at half maximum is approximately 55 nm. Such Eu-activated β-Sialon phosphor can be produced by, for example, first mixing powders of silicon nitride, aluminum nitride, and europium oxide and then, putting the powders in a crucible made of boron nitride and reacting the powders in nitrogen under 1 MPa at 1900° C. for 8 hours and then, grinding them.

Moreover, as the nitride phosphor that is suitable for second phosphor 3, for example, a red phosphor of an Eu-activated $CaAlSiN_3$ ($CaAlSiN_3$:$Eu^{3+}$) described in Kyota Uheda, Naoto Hirosaki, Hajime Yamamoto, Rong-Jun Xie, "Red phosphors for warm white light-emitting diodes" 305th meeting digest of Phosphor Research Society, 2004, pp. 37-47 is particularly preferably used. The $CaAlSiN_3$:$Eu^{3+}$ red phosphor has characteristics that the emission peak wavelength is approximately 650 nm and that the emission spectrum full width at half maximum is approximately 90 nm or more. Such $CaAlSiN_3$:$Eu^{3+}$ can be produced by, for example, first mixing powders of silicon nitride, aluminum nitride, calcium nitride and europium nitride and then, putting the powders in a glove box blocking moisture and air and then in a crucible made of boron nitride and reacting the powders in nitrogen under 1 MPa at 1600 to 1800° C. for 4 hours and then, grinding them.

As described above, the light emitting device 1 of the present invention has, first phosphor 2 that is the oxynitride phosphor of the present invention, and second phosphor(s) 3 that emit(s) a fluorescence having a longer wavelength than the fluorescence emitted by first phosphor 2. Here, as described above, first phosphor 2 that is an oxynitride phosphor of the present invention has an emission peak wavelength of 450 to 510 nm and a large emission spectrum full width at half maximum of 80 nm or more and therefore, is very useful for production of a light emitting device having excellent color-rendering properties. Conventionally, in the case of a light emitting device using an excited light of ultraviolet to purple, it is general to combine three colors of blue, green and red (Japanese Patent Laying-Open No. 2002-171000). This is because only a conventional blue phosphor having shortish emission peak wavelength of approximately 450 nm and having a small emission spectrum full width at half maximum can be obtained although the phosphor has relatively high emission efficiency. However, in light emitting device 1 of the present invention using the oxynitride phosphor of the present invention as the first phosphor, a large part of visible light region can be covered only by first phosphor 2 and furthermore, by combining the above-described phosphor of yellow that is a complementary color to blue for obtaining white, the light emitting device having excellent color-rendering properties can be obtained.

In FIG. 12, the case that the above-described yellow phosphor of $Ca_{0.93}Eu_{0.07}Si_9Al_3ON_{15}$ is used as one kind of second phosphor 3 is exemplified. By using only one kind of second phosphor 3 and combining therewith first phosphor 2 that is the oxynitride phosphor of the present invention as shown in the example of FIG. 12, there is an advantage that dispersion of particles of the phosphors to resin can be reduced and luminosity can be enhanced. Moreover, because phosphors having analogous physical characteristics such as specific gravity are mixed, the phosphors can be dispersed almost uniformly in resin and there is an advantage that emission color variations of emission direction and between the light emitting devices are small. Furthermore, in an example shown in FIG. 12, both of first phosphor 2 and second phosphor 3 are one kind of oxynitride phosphor (silicon oxynitride) and, fluctuation of emission efficiencies due to temperature change in driving is small and therefore, change of chromaticity is small in a large driving-temperature range of 0 to 100° C. and therefore, the light emitting device having no change of visual color tone due to temperature can be obtained.

Figure 13:
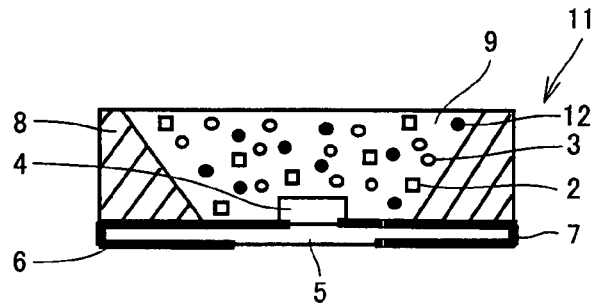
FIG. 13 is a section view that schematically shows a light emitting device 11 of a preferable second example of the present invention.

FIG. 13 is a section view that schematically shows light emitting device 11 of a preferable second example of the present invention. Light emitting device 11 of the example shown in FIG. 13 has the same structure as light emitting device 1 of the example shown in FIG. 12 except that two kinds of second phosphors 3, 12 are used. The same reference marks are attached to the parts having the same structure and description thereof is not given here. In the light emitting device of the present invention, a plurality of kinds of the second phosphors may be naturally used as the example shown in FIG. 13. As light emitting device 11 of the example shown in FIG. 13, there is shown an example in which, for example, a yellow phosphor (such as $(Ca_{0.93}Eu_{0.07})_{0.25}Si_{11.25}Al_{0.75}ON_{15.75}$) is used as second phosphor 3 and a red phosphor (such as $CaAlSiN_3:Eu^{3+}$) is used as second phosphor 12. In the case of using such two kinds of combined second phosphors, there is an advantage that more natural emission can be obtained compared to light emitting device 1 of the example shown in FIG. 12.

Figure 14:
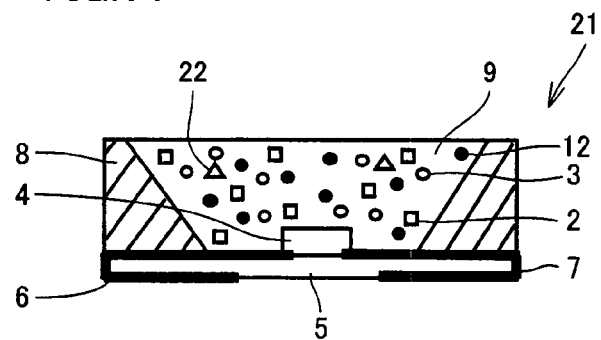
FIG. 14 is a section view that schematically shows a light emitting device 21 of a preferable third example of the present invention.

FIG. 14 is a section view that schematically shows light emitting device 21 of a preferable third example of the present invention. Light emitting device 21 of the example shown in FIG. 14 has the same structure as light emitting device 1 of the example shown in FIG. 12 except that three kinds of second phosphors 3, 12, 22 are used. The same reference marks are attached to the parts having the same structure and description thereof is not given here. As light emitting device 21 of the example shown in FIG. 14, there is shown an example in which, for example, a yellow phosphor (such as $(Ca_{0.93}Eu_{0.07})_{0.25}Si_{11.25}Al_{0.75}ON_{15.75}$) is used as second phosphor 3 and a red phosphor (such as $CaAlSiN_3:Eu^{3+}$) is used as second phosphor 12 and a green phosphor (such as $Eu_{0.003}Si_{0.414}Al_{0.013}O_{0.005}N_{0.56528}$) is used as second phosphor 22. In the case of using such three kinds of combined second phosphors, there is an advantage that warmer and more natural emission can be obtained compared to light emitting devices 1, 11 of the example shown in FIGS. 12, 13 because a valley of emission in a green region can be covered by using a green phosphor. In addition, an object of the green phosphor used in FIG. 14 is to bury the valley of emission spectrums between first phosphor 2 (blue phosphor or blue-green phosphor) that is the oxynitride phosphor of the present invention and a yellow phosphor that is second phosphor 3 and therefore, the green phosphor may have an emission spectrum full width at half maximum of 45 nm or more. Conversely, when the green phosphor having a too large full width at half maximum is used, there is a fear that flatness of the emission spectrum comes to disappear and that the emission becomes unnatural because green is in a wavelength region having intensive visibility. It is preferable that the green phosphor used in the example of FIG. 14 has an emission peak wavelength of 510 to 565 nm, and 520 to 550 nm is more preferable.

Semiconductor light emitting element 4 used in light emitting devices 1, 11, 21 of the present invention is not particularly limited as long as it has a favorable electricity-light conversion efficiency and having an emission peak wavelength that is in the vicinity of emission peak wavelength of excitation spectrum of the phosphor. However, it is preferable that the semiconductor light emitting element has an emission peak wavelength in the range of 350 to 420 nm, and it is more preferable that the element in the range of 390 to 410 nm is used. That is, this is because 350 nm or more which contains the peak wavelength of excitation spectrum of the first phosphor that is the oxynitride phosphor of the present invention is preferable, and in the case of more than 420 nm, the spectrum of excited light gets in a visible region and, effects on the emission color are prone to become larger.

As such semiconductor light emitting element 4, LED whose active layer is an InGaN-based material made of, for example, a GaN-based semiconductor (semiconductor containing at least Ga and N in which Al, In, n-type dopant, p-type dopant, and so forth are used according to need) is suitably used. In particular, among InGaN-based semiconductor light emitting elements, LED whose emission peak wavelength in which electricity-light conversion efficiency is favorable is in the range of 390 to 420 nm is preferable. In FIGS. 12 to 14, the examples in which LED having an emission peak wavelength of 405 nm whose visibility is low is used are shown as semiconductor light emitting element 4. By using such LED, visible lights from the light emitting device can be emitted entirely only by the phosphors and, as a result, fluctuation of emission spectrums due to individual difference of LEDs that are excitation light sources or due to balance disagreement of emission intensity between LED and phosphor is small and therefore, there is an advantage that the light emitting device in which chromaticity is stabilized can be realized. In addition, as semiconductor light emitting element 4 of the examples shown in FIGS. 12 to 14, a semiconductor light emitting element having a p-type electrode and a n-type electrode on one surface is used. In addition, a semiconductor laser having an emission peak wavelength in the above-described preferable range may be naturally used as semiconductor light emitting element 4 in the light emitting device of the present invention.

A sealing member 9 for dispersing and sealing the phosphors in light emitting devices 1, 11, 21 of the present invention can be formed with an appropriate material that is conventionally known and, synthetic resin such as silicon resin and epoxy resin or glass can be suitably used. Moreover, substrate 5, frame 8, and so forth can be realized with appropriate materials that are conventionally known.

It is preferable that the light emitting device of the present invention is realized so that a chromaticity coordinate x of emission of the light emitting device is 0.22 to 0.44 and a chromaticity coordinate y thereof is 0.22 to 0.44, or a chromaticity coordinate x of emission of the light emitting device is 0.36 to 0.5 and a chromaticity coordinate y thereof is 0.33 to 0.46. When the device has chromaticity coordinates x, y in any one of the ranges, a color that is effective as white lighting can be obtained. In particular, in the latter case, a substitutable light emitting device having a white-based color tone of light bulb color whose color temperature is low such as a conventional tungsten lump can be realized as a general light. In this case, compared with a conventional technology such as tungsten lump, the light emitting device has many advantages that no emission exists in an infrared region and therefore, the energy efficiency is high, heat release to the ambient environment is small, the operation life is drastically long, and so forth.

In addition, such a light emitting device can be designed by appropriately controlling the respective composition ratios of the first phosphor and the second phosphor in the above-described preferable ranges. In such a first phosphor and a second phosphor as described above that are used in the light emitting device of the present invention, while holding the high emission efficiency, the emission peak wavelengths can be controlled in a wide range by changing composition ratios of the materials, respectively. Accordingly, in the present invention, this characteristic is utilized and, by controlling not only mixing ratio of phosphors but also the respective composition ratios, the light emitting device having various white-based color tones from daylight color having high color temperature to light bulb color having low color temperature (such as a light emitting device having chromaticity coordinates x, y in the above-described range) can be freely designed and realized.

In addition, the light emitting device of the present invention may be realized so as to appropriately have a structure other than the above-described structures, in the range that the effect of the present invention is not inhibited. Moreover, it is naturally possible that as the second phosphor, an appropriate phosphor that is conventionally known other than the above-described structures (such as TAG ($TbAl_5O_{12}$) phosphor and $M_2Si_5N_8$ (M=Ca, Ba, Sr) phosphor) is appropriately added thereto in the range that effects of the present invention are not inhibited.

Hereinafter, the present invention will be more specifically described with reference to Examples and Comparative Examples. However, the present invention is no limited thereto.

EXAMPLES 1 TO 7, COMPARATIVE EXAMPLES 1, 2

Samples of Examples 1 to 5 represented by a composition formula $La_{0.5-j}Ca_jCe_{0.5}Si_bAl_cO_dN_e$ and each having a different composition ratio j of Ca in the range of $0<j\leq0.315$ and four kinds of samples (Examples 6, 7, Comparative Examples 1, 2) having other Ca composition ratios j were produced as follows.

A silicon nitride powder having an average particle diameter of 0.5 μm and an oxygen content of 0.93% by weight and an α-type content of 92%, an aluminum nitride powder, calcium carbonate powder, a lanthanum oxide powder, and a cerium oxide powder were weighted and mixed so as to be the material proportions (% by weight) described in Table 2, respectively. This mixed powder was put in a crucible made of boron nitride and the crucible was introduced in a graphite resistance-heating-type electric furnace.

TABLE 2

|  | $Si_3N_4$ | AlN | $CaCO_3$ | $La_2O_3$ | $CeO_2$ |
|---|---|---|---|---|---|
| Comparative Example 1 | 4.837 | 16.963 | 0.000 | 1.685 | 1.781 |
| Example 1 | 4.934 | 16.555 | 1.300 | 1.486 | 1.794 |
| Example 2 | 5.033 | 16.142 | 2.630 | 1.283 | 1.807 |
| Example 3 | 5.133 | 15.721 | 3.970 | 1.077 | 1.821 |
| Example 4 | 5.234 | 15.294 | 5.340 | 0.868 | 1.835 |
| Example 5 | 5.337 | 14.861 | 6.720 | 0.656 | 1.849 |
| Example 6 | 5.441 | 14.421 | 8.130 | 0.441 | 1.863 |
| Example 7 | 5.547 | 13.974 | 9.550 | 0.222 | 1.878 |
| Comparative Example 2 | 5.655 | 13.520 | 11.000 | 0.000 | 1.893 |

Next, after the inside of the electric furnace was exhausted by a vacuum pump, heating was performed from a room temperature to 800° C. At this time, a nitrogen gas having a purity of 99.999% by volume was introduced, and the pressure was set to be 1 MPa. Furthermore, firing was performed by heating to 1700° C. at approximately 500° C./hr and then holding the temperature for 2 hours. After the firing, the temperature was set to the room temperature and the samples were taken out and thereby, the samples (sintered bodies) of Examples 1 to 7 and Comparative Examples 1, 2 were obtained. The compositions of chemical elements of these samples after the firing are shown in Table 3.

TABLE 3

|  | Si | O | Al | N | Ca | La | Ce | Rate of Content of JEM Phase (%) |
|---|---|---|---|---|---|---|---|---|
| Comparative Example 1 | 5.000 | 1.500 | 2.000 | 8.667 | 0.000 | 0.500 | 0.500 | 95 |
| Example 1 | 5.063 | 1.469 | 1.938 | 8.688 | 0.063 | 0.438 | 0.500 | 96 |
| Example 2 | 5.125 | 1.438 | 1.875 | 8.708 | 0.125 | 0.375 | 0.500 | 95 |
| Example 3 | 5.188 | 1.406 | 1.813 | 8.729 | 0.188 | 0.313 | 0.500 | 95 |
| Example 4 | 5.250 | 1.375 | 1.750 | 8.750 | 0.250 | 0.250 | 0.500 | 93 |
| Example 5 | 5.313 | 1.344 | 1.688 | 8.771 | 0.313 | 0.188 | 0.500 | 94 |
| Example 6 | 5.375 | 1.313 | 1.625 | 8.792 | 0.375 | 0.125 | 0.500 | 95 |
| Example 7 | 5.438 | 1.281 | 1.563 | 8.813 | 0.438 | 0.063 | 0.500 | 93 |
| Comparative Example 2 | 5.500 | 1.250 | 1.500 | 8.833 | 0.500 | 0.000 | 0.500 | 93 |

Figure 15:
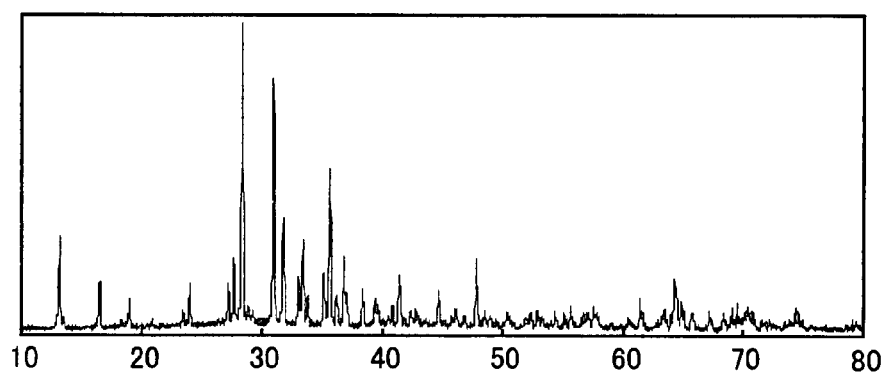
FIG. 15 shows a result of a powder X-ray diffraction measurement of the sample obtained in Example 4.

Among the samples obtained by the above-described method, by the following method, it was found that in the samples of Examples 1 to 7, JEM phase ($0.1\leq z\leq 3$) represented by a formula $La_{0.5-j}Ca_jCe_{0.5}Al(Si_{6-z}Al_z)N_{10-z}O_z$ was the main component. First, each of the fired samples was crushed into powders in a mortar, and powder X-ray diffraction measurement through Cu—Kα ray was performed. In FIG. 15, as its representative example, the result of the powder X-ray diffraction measurement of the sample obtained in Example 4 is shown.

By using this powder X-ray diffraction measurement result, an X-ray diffraction graphic simulation was performed by Liebert analysis calculation program (RIETAN-2000), and therefore, it became clear that there were major peaks derived from JEM phase and minor peaks derived from β-Sialon. From these results, it was found that in the sample of Example 4, the main component was JEM phase and β-Sialon was a by-product.

Furthermore, the rate of content of JEM phase was calculated from the peak intensity proportion of JEM phase and β-Sialon and therefore, JEM phase was confirmed to be contained so that the proportion of the JEM phase fired by the above-described production method in each of Examples was a high proportion of 70% or more. In addition, the rate of content of JEM phase was calculated form the following formula.

Rate of Content of *JEM* Phase (%)=100×(Maximum Peak Intensity of *JEM* Phase)/(Maximum peak intensity of β-Sialon)

In addition, in all of the above-described Examples, a Ce composition ratio a was set to be 0.5. However, a highly efficient phosphor can be obtained in $0<a\leq 1$ in the same method. In particular, in $0.1\leq a\leq 1$, a highly efficient phosphor that was suitable for near-ultraviolet excitation could be obtained.

In these Examples, the crystal compositions contained an alkaline-earth metal. However, in the case that an alkaline-earth metal is contained, the melting temperature of the material was prone to be low and crystallization was promoted even at a temperature lower than that of the case that an alkaline-earth metal is not contained by approximately 100 to 200° C. Accordingly, crystals having high safety could be synthesized at a lower temperature than that of JEM phase not containing an alkaline-earth metal, and effects such as nitrogen separation were small, and unnecessary absorption in visible lights by glass phase could be reduced.

EXAMPLES 8 TO 14, COMPARATIVE EXAMPLE 3

Samples of Examples 8 to 13 represented by a composition formula $La_{0.5-j}Sr_jCe_{0.5}Si_bAl_cO_dN_e$ and each having a different composition ratio j of Sr in the range of $0<j\leq 0.375$ and two kinds of samples (Example 14, Comparative Example 3) having other Sr composition ratios j were produced as follows.

A silicon nitride powder having an average particle diameter of 0.5 μm and an oxygen content of 0.93% by weight and an α-type content of 92%, an aluminum nitride powder, a strontium carbonate powder, a lanthanum oxide powder, and a cerium oxide powder were weighted and mixed so as to be the material proportions (% by weight) described in Table 4, respectively. This mixed powder was put in a crucible made of boron nitride and the crucible was introduced in a graphite resistance-heating-type electric furnace.

TABLE 4

| | $Si_3N_4$ | AlN | $SrCO_3$ | $La_2O_3$ | $CeO_2$ |
|---|---|---|---|---|---|
| Example 8 | 4.904 | 1.645 | 0.191 | 1.477 | 1.783 |
| Example 9 | 4.971 | 1.594 | 0.383 | 1.267 | 1.785 |
| Example 10 | 5.037 | 1.543 | 0.575 | 1.057 | 1.787 |
| Example 11 | 5.104 | 1.492 | 0.767 | 0.847 | 1.790 |
| Example 12 | 5.172 | 1.440 | 0.961 | 0.636 | 1.792 |
| Example 13 | 5.239 | 1.389 | 1.154 | 0.424 | 1.794 |
| Example 14 | 5.306 | 1.337 | 1.348 | 0.213 | 1.796 |
| Comparative Example 3 | 5.374 | 1.285 | 1.543 | 0.000 | 1.799 |

Next, after the inside of the electric furnace was exhausted by a vacuum pump, heating was performed from a room temperature to 800° C. At this time, a nitrogen gas having a purity of 99.999% by volume was introduced, and the pressure was set to be 1 MPa. Furthermore, firing was performed by heating to 1700° C. at approximately 500° C./hr and then holding the temperature for 2 hours. After the firing, the temperature was set to the room temperature and the samples were taken out and thereby, the samples (sintered bodies) of Examples 8 to 14 and Comparative Example 3 were obtained. The compositions of chemical elements of these samples after the firing are shown in Table 5.

TABLE 5

| | Si | O | Al | N | Sr | La | Ce | Rate of Content of JEM Phase (%) |
|---|---|---|---|---|---|---|---|---|
| Example 8 | 5.063 | 1.469 | 1.938 | 8.688 | 0.063 | 0.438 | 0.500 | 96 |
| Example 9 | 5.125 | 1.438 | 1.875 | 8.708 | 0.125 | 0.375 | 0.500 | 94 |
| Example 10 | 5.188 | 1.406 | 1.813 | 8.729 | 0.188 | 0.313 | 0.500 | 95 |
| Example 11 | 5.250 | 1.375 | 1.750 | 8.750 | 0.250 | 0.250 | 0.500 | 95 |
| Example 12 | 5.313 | 1.344 | 1.688 | 8.771 | 0.313 | 0.188 | 0.500 | 96 |
| Example 13 | 5.375 | 1.313 | 1.625 | 8.792 | 0.375 | 0.125 | 0.500 | 94 |
| Example 14 | 5.438 | 1.281 | 1.563 | 8.813 | 0.438 | 0.063 | 0.500 | 93 |
| Comparative Example 3 | 5.500 | 1.250 | 1.500 | 8.833 | 0.500 | 0.000 | 0.500 | 92 |

The rates of content of JEM phase of the sintered bodies fired by the above-described method were calculated by the same method as the above-described Examples and thereby, it was found that JEM phase ($0.1\leq z\leq 3$) represented by a formula $La_{0.5-j}Sr_jCe_{0.5}Al(Si_{6-z}Al_z)N_{10-z}O_z$ was the main component. Each of the fired samples was crushed into powders in a mortar, and powder X-ray diffraction measurement through Cu—Kα ray was performed and therefore, almost the same spectrum as FIG. 15 was obtained.

In addition, in all of the above-described Examples, a Ce composition ratio a was set to be 0.5. However, a highly efficient phosphor can be obtained in $0<a\leq 1$ in the same method. In particular, in $0.1\leq a\leq 1$, a highly efficient phosphor that was suitable for near-ultraviolet excitation could be obtained.

In these Examples, the crystal compositions contained an alkaline-earth metal. However, in the case that an alkaline-earth metal is contained, the melting temperature of the material was prone to be low and crystallization was promoted even at a temperature lower than that of the case that an alkaline-earth metal is not contained by approximately 100 to 200° C. Accordingly, crystals having high safety could be synthesized at a lower temperature than that of JEM phase not containing an alkaline-earth metal, and effects such as nitrogen separation were small, and unnecessary absorption in visible lights by glass phase could be reduced.

EXAMPLES 15 TO 22

Samples of Examples 15 to 19 represented by a composition formula $La_{0.5-j}Ba_jCe_{0.5}Si_bAl_cO_dN_e$ and each having a different composition ratio j of Ba in the range of $0<j\leq 0.125$ and three kinds of samples (Examples 20 to 22) having other Ba composition ratios j were produced as follows.

A silicon nitride powder having an average particle diameter of 0.5 μm and an oxygen content of 0.93% by weight and an α-type content of 92%, an aluminum nitride powder, a barium carbonate powder, a lanthanum oxide powder, and a cerium oxide powder were weighted and mixed so as to be the material proportions (% by weight) described in Table 6, respectively. This mixed powder was put in a crucible made of boron nitride and the crucible was introduced in a graphite resistance-heating-type electric furnace.

TABLE 6

|  | $Si_3N_4$ | AlN | $BaCO_3$ | $La_2O_3$ | $CeO_2$ |
|---|---|---|---|---|---|
| Example 15 | 4.855 | 1.666 | 0.127 | 1.576 | 1.776 |
| Example 16 | 4.873 | 1.635 | 0.254 | 1.467 | 1.772 |
| Example 17 | 4.890 | 1.604 | 0.380 | 1.359 | 1.767 |
| Example 18 | 4.907 | 1.574 | 0.505 | 1.251 | 1.763 |
| Example 19 | 4.942 | 1.514 | 0.754 | 1.037 | 1.754 |
| Example 20 | 4.976 | 1.454 | 1.000 | 0.826 | 1.745 |
| Example 21 | 5.010 | 1.395 | 1.244 | 0.616 | 1.736 |
| Example 22 | 5.043 | 1.337 | 1.485 | 0.409 | 1.727 |

Next, after the inside of the electric furnace was exhausted by a vacuum pump, heating was performed from a room temperature to 800° C. At this time, a nitrogen gas having a purity of 99.999% by volume was introduced, and the pressure was set to be 1 MPa. Furthermore, firing was performed by heating to 1700° C. at approximately 500° C./hr and then holding the temperature for 2 hours. After the firing, the temperature was set to the room temperature and the samples were taken out and thereby, the samples (sintered bodies) of Examples 15 to 22 were obtained. The compositions of chemical elements of these samples after the firing are shown in Table 7.

TABLE 7

|  | Si | O | Al | N | Ba | La | Ce | Rate of Content of JEM Phase (%) |
|---|---|---|---|---|---|---|---|---|
| Example 15 | 5.031 | 1.484 | 1.969 | 8.677 | 0.031 | 0.469 | 0.500 | 95 |
| Example 16 | 5.063 | 1.469 | 1.938 | 8.688 | 0.063 | 0.438 | 0.500 | 94 |
| Example 17 | 5.094 | 1.453 | 1.906 | 8.698 | 0.094 | 0.406 | 0.500 | 93 |
| Example 18 | 5.125 | 1.438 | 1.875 | 8.708 | 0.125 | 0.375 | 0.500 | 91 |
| Example 19 | 5.188 | 1.406 | 1.813 | 8.729 | 0.188 | 0.313 | 0.500 | 90 |
| Example 20 | 5.250 | 1.375 | 1.750 | 8.750 | 0.250 | 0.250 | 0.500 | 89 |
| Example 21 | 5.316 | 1.344 | 1.688 | 8.771 | 0.313 | 0.188 | 0.500 | 87 |
| Example 22 | 5.375 | 1.313 | 1.625 | 8.792 | 0.375 | 0.125 | 0.500 | 85 |

The rates of content of JEM phase of the sintered bodies fired by the above-described method were calculated by the same method as the above-described Examples and thereby, it was found that JEM phase ($0.1 \leq z \leq 3$) represented by a formula $La_{0.5-j}Ba_jCe_{0.5}Al(Si_{6-z}Al_z)N_{10-z}O_z$ was the main component. Each of the fired samples was crushed into powders in a mortar, and powder X-ray diffraction measurement through Cu—Kα ray was performed and therefore, almost the same spectrum as FIG. 15 was obtained.

In addition, in all of the above-described Examples, a Ce composition ratio a was set to be 0.5. However, a highly efficient phosphor can be obtained in $0 < a \leq 1$ in the same method. In particular, in $0.1 \leq a \leq 1$, a highly efficient phosphor that was suitable for near-ultraviolet excitation could be obtained.

In these Examples, the crystal compositions contained an alkaline-earth metal. However, in the case that an alkaline-earth metal is contained, the melting temperature of the material was prone to be low and crystallization was promoted even at a temperature lower than that of the case that an alkaline-earth metal is not contained by approximately 100 to 200° C. Accordingly, crystals having high safety could be synthesized at a lower temperature than that of JEM phase not containing an alkaline-earth metal, and effects such as nitrogen separation were small, and unnecessary absorption in visible lights by glass phase could be reduced.

In the case of using such a composition as described above, a high JEM phase proportion can be obtained relatively easily. However, in the case that the firing condition is not appropriate, the rate of content of JEM phase is degraded and the emission efficiency is degraded.

For example, with the same composition as Example 2, the case of setting the firing temperature to be 1650° C. and the case of setting the firing temperature to be 1600° C. were investigated and therefore, in the former case, the rate of content of JEM phase was 75%, and the emission efficiency was degraded to be 90% compared to Example 2, and absorbance of a light having a wavelength of 590 nm increased by 50% compared to Example 2. Moreover, in the latter case, the rate of content of JEM phase was 50%, and the emission efficiency was degraded to be 50% compared to Example 2, and absorbance of a light having a wavelength of 590 nm increased by 70% compared to Example 2.

Moreover, with the same composition as Example 18, the case of setting the firing temperature to be 1850° C. and the case of setting the firing temperature to be 1900° C. were investigated and therefore, in the former case, the rate of content of JEM phase was 73%, and the emission efficiency was degraded to be 80% compared to Example 18, and absorbance of a light having a wavelength of 590 nm increased by 60% compared to Example 18. Moreover, in the latter case, the rate of content of JEM phase was 47%, and the emission efficiency was degraded to be 30% compared to Example 18, and absorbance of a light having a wavelength of 590 nm increased by 110% compared to Example 18.

In the crystal phase other than JEM phase in these cases, α-Sialon phase was contained as well as β-Sialon. Accordingly, phase proportion was calculated as Rate of Content (%) of JEM phase=100×(Maximum Peak Intensity of JEM phase)/(Sum of Maximum Peak Intensity of JEM phase+Maximum Peak Intensities of Phases other than JEM phase).

EXAMPLE 23

Light emitting device 1 of the example shown in FIG. 12 was produced. As first phosphor 2, the oxynitride phosphor (blue phosphor) of the present invention that was obtained in Example 11 was used, and as second phosphor 3, α-Sialon phosphor (yellow phosphor) of the composition formula $Ca_{0.93}Eu_{0.07}Si_9Al_3ON_{15}$ was used, and the emission color of the light emitting device was set to be white. These phosphors were mixed in a proportion (weight ratio) of blue phosphor:yellow phosphor=16:6, and as sealing member 9, a silicone resin was used and the phosphors were dispersed and sealed in the resin. Moreover, as semiconductor light emitting element 4, InGaN-based semiconductor LED having an emission peak wavelength of 405 nm was used.

The blue phosphor obtained in Example 11 that was used as first phosphor 2 in the present Example had a small light absorbance of 0.2 in a wavelength of 590 nm (yellow) and therefore, absorption of the fluorescence from the combined and used yellow phosphor that was second phosphor 3 was small, and emission efficiency of the blue phosphor itself was also large. Therefore, 2220 millicandelas was obtained as a luminosity of the light emitting device in a drive current of 40 mA of semiconductor light emitting element 4.

Moreover, the blue phosphor used in the present Example had an emission peak wavelength of approximately 490 nm and a large emission spectrum full width at half maximum of approximately 120 nm, and only by the blue phosphor, a large part of the visible light region could be covered. In the present Example, with such a blue phosphor, the above-described yellow phosphor was combined as second phosphor 3 and used and thereby, the light emitting device of white having excellent color-rendering properties could be obtained.

In the present Example, light absorption of yellow by the blue phosphor is small, and the emission efficiency of the blue phosphor itself is favorable and additionally, only two kinds of phosphors are used and dispersion amount of particles of phosphors to the resin can be small and therefore, its luminosity could be large.

Figure 16:
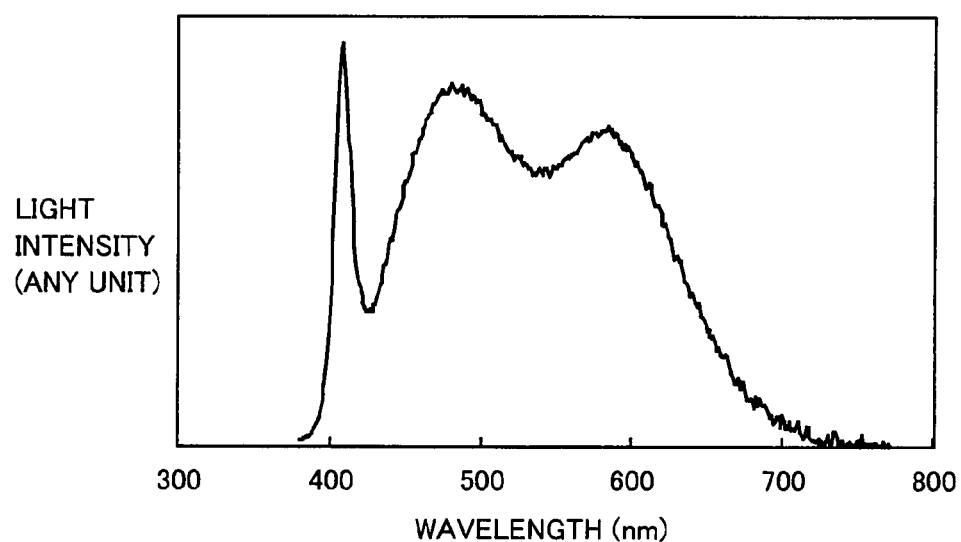
FIG. 16 shows an emission spectrum of the light emitting device obtained in Example 23.

The emission spectrum of the above-described light emitting device in which two kinds of phosphors were mixed is shown in FIG. 16. Emission of this light emitting device indicated a daylight color having a chromaticity coordinate x=0.32 and a chromaticity coordinate y=0.35. An average evaluation value Ra of color-rendering properties to be a rough standard for natural emission was 88, which was high. Moreover, each of the blue phosphor and the yellow phosphor is one kind of the oxynitride phosphor (silicon oxynitride) and, fluctuation of the emission efficiency due to temperature change in driving is small and therefore, change of chromaticity in the large driving temperature range of 0° C. to 100° C. is ⅙ to ¼ compared to the light emitting device using an oxynitride phosphor of Comparative Example 1. Thereby, a light emitting device having almost no change of visual color tone due to temperature could be obtained.

COMPARATIVE EXAMPLE 4

Figure 17:
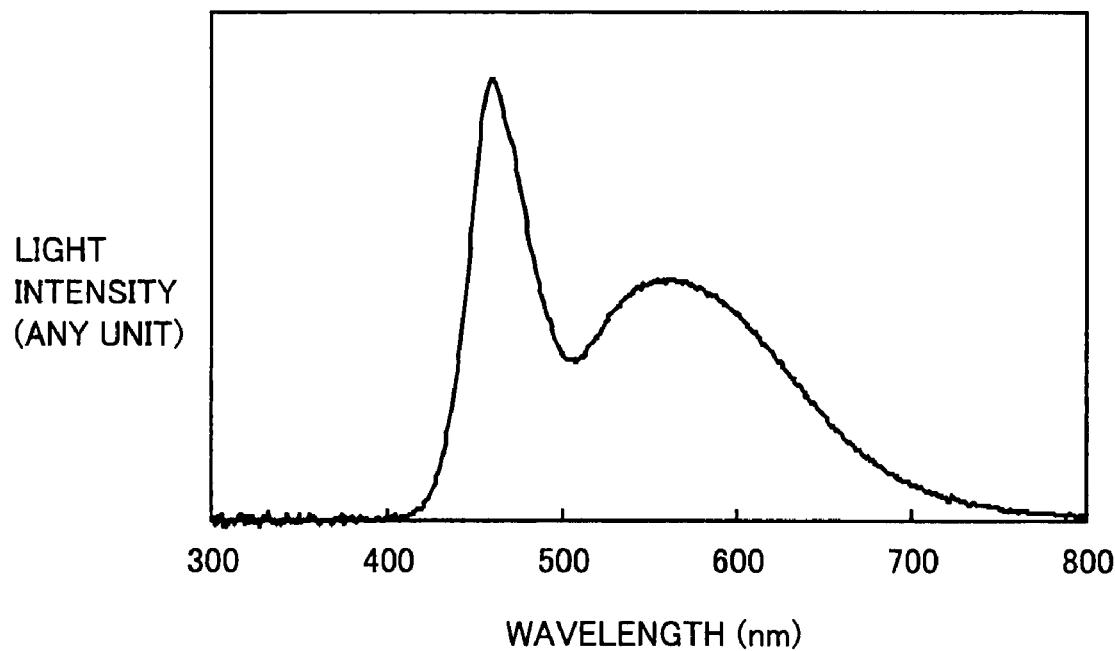
FIG. 17 shows an emission spectrum of the light emitting device obtained in Comparative Example 4.

As one example of a light emitting device that has been conventionally used, there is a light emitting device in which a blue light emitting diode and a phosphor of YAG:$Ce^{3+}$ emitting a yellow fluorescence by an excitation light emitted from the blue light emitting diode are combined (Japanese Patent Laying-Open No. 10-163535). The emission spectrum of the light emitting device of Comparative Example 4 having this constitution is shown in FIG. 17. In this case, the blue light emitted from the light emitting diode and the yellow emitted from the phosphor of YAG:$Ce^{3+}$ are related to be just complementary colors and thereby, emission appearing to be pseudo white is shown. However, the emission spectrum full width at half maximum of a blue light is narrow and therefore, there is a tumble of emission intensity in the vicinity of 500 nm. Therefore, the emission spectrum becomes unnatural, being different from that of a natural light. An average evaluation value Ra of color-rendering properties is 84, which is lower than that of Example 23.

EXAMPLE 24

By the same method as Example 23 except for replacing the blue phosphor to a blue phosphor having slightly higher absorbance of a long wavelength light (the composition is the same as Example 11 and the rate of content of JEM phase: 85%), the light emitting device of Example 24 was produced. However, this blue phosphor was produced at a firing temperature of 1950° C. and therefore, although the absorbance in a wavelength of 590 nm in each of Examples was 15% or less, this phosphor had the absorbance of approximately 30%. In the light emitting device of Example 24, luminosity in a driving current of 40 mA was 760 millicandelas (42% of Example 23), and the emission color had a chromaticity coordinate x=0.35 and a chromaticity coordinate y=0.36. As this reason, it is thought that the light absorbance of the blue phosphor used in Example 24 was higher in wavelength of yellow than the above-described blue phosphor used in Example 23 and therefore, the effect of attenuation of the yellow florescence and the effect that the emission efficiency itself of the blue phosphor used in Example 24 was lower than that of the above-described blue phosphor used in Example 23 were synthesized in regard to the reduction of luminosity and functioned, and were negated each other in regard to change of chromaticity. Moreover, five samples of the light emitting device were produced and therefore, variability of chromaticity among the samples was larger than that of Example 23.

EXAMPLE 25

Light emitting device 11 of the example shown in FIG. 13 was produced. As first phosphor 2, the oxynitride phosphor (blue phosphor) of the present invention that was obtained in Example 11 was used, and as second phosphor 3, α-Sialon phosphor (yellow phosphor) of the composition formula $(Ca_{0.93}Eu_{0.07})_{0.25}Si_{11.25}Al_{0.75}ON_{15.75}$ was used, and as second phosphor 12, $CaAlSiN_3:Eu^{3+}$ (Eu activation amount: 0.8%) described in Kyota Uheda, Naoto Hirosaki, Hajime Yamamoto, Rong-Jun Xie, "Red phosphors for warm white light-emitting diodes" 305th meeting digest of Phosphor Research Society, 2004, pp. 37-47 was used and thereby, the emission color of the light emitting device was set to be white. These phosphors were mixed at a proportion (weight ratio) of blue phosphor:yellow phosphor:red phosphor=16:6:2, and as sealing member 9, a silicone resin was used and the phosphors were dispersed and sealed in the resin. The red phosphor used in the present Example has very high emission efficiency and therefore, its added amount was set to be approximately 10% of the total sum of the phosphors. Therefore, absorption of excited light and dispersion of fluorescence by the red phosphor were small, and degradation of luminosity of the light emitting device was hardly seen. Moreover, as semiconductor light emitting element 4, InGaN-based semiconductor LED having an emission peak wavelength of 405 nm was used.

Figure 18:
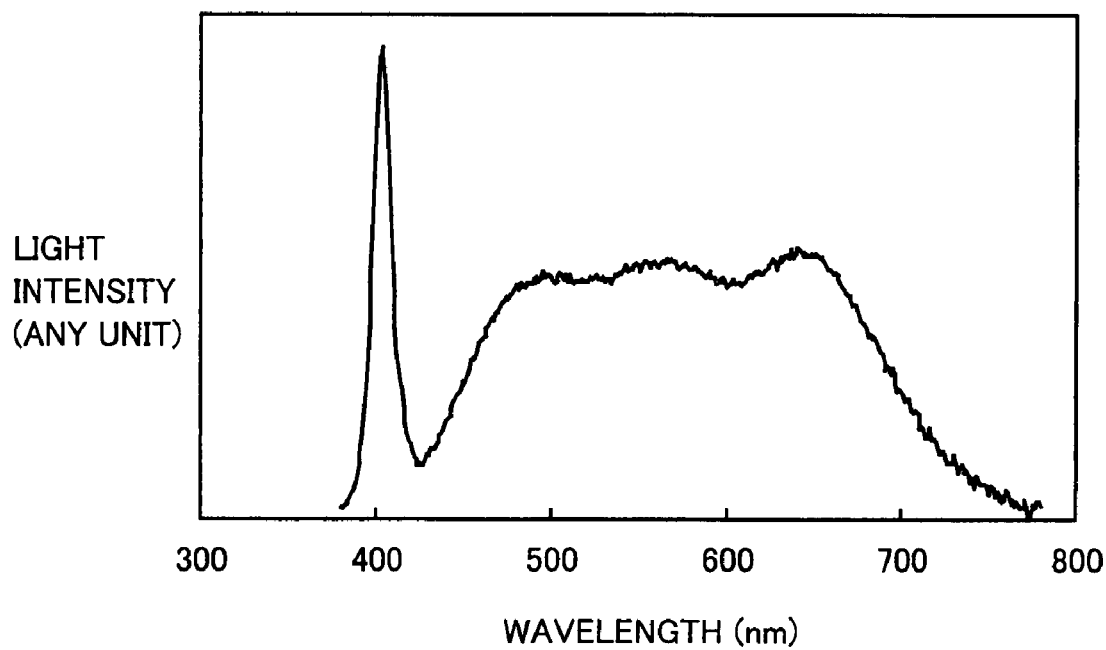
FIG. 18 shows an emission spectrum of the light emitting device obtained in Example 25.

The red phosphor used in the present Example has an emission spectrum full width at half maximum of approximately 95 nm and performs emission in a red visible light region that is not sufficiently obtained only by the blue phosphor and the yellow phosphor and thereby, a flat emission spectrum can be obtained. The emission spectrum of the light emitting device that was obtained in Example 25 is shown in FIG. 18. The emission of this light emitting device indicated white having a chromaticity coordinate x=0.37 and a chromaticity coordinate y=0.39, and its luminosity was 1810 millicandelas (in a drive current of 40 mA of semiconductor light emitting element 4). As seen from the emission spectrum, uniform emission was obtained over the entire visible-light region. An average evaluation value Ra of color-rendering properties to be a rough standard for natural emission was 96, which was high. For obtaining favorable color-rendering properties as described above, it is desirable that the emission spectrum full width at half maximum of the red phosphor is wider than 80 nm.

COMPARATIVE EXAMPLE 5

By the same method as Example 25 except that $BaMgA_{10}O_{17}:Eu^{2+}$ was used as the blue phosphor and that $SrAl_2O_4:Eu^{2+}$ was used as the green phosphor and that $0.5MgF_2.3.5MgO.GeO_2:Mn^{4+}$ was used as the red phosphor, the light emitting device of Comparative Example 5 was produced.

Figure 19:
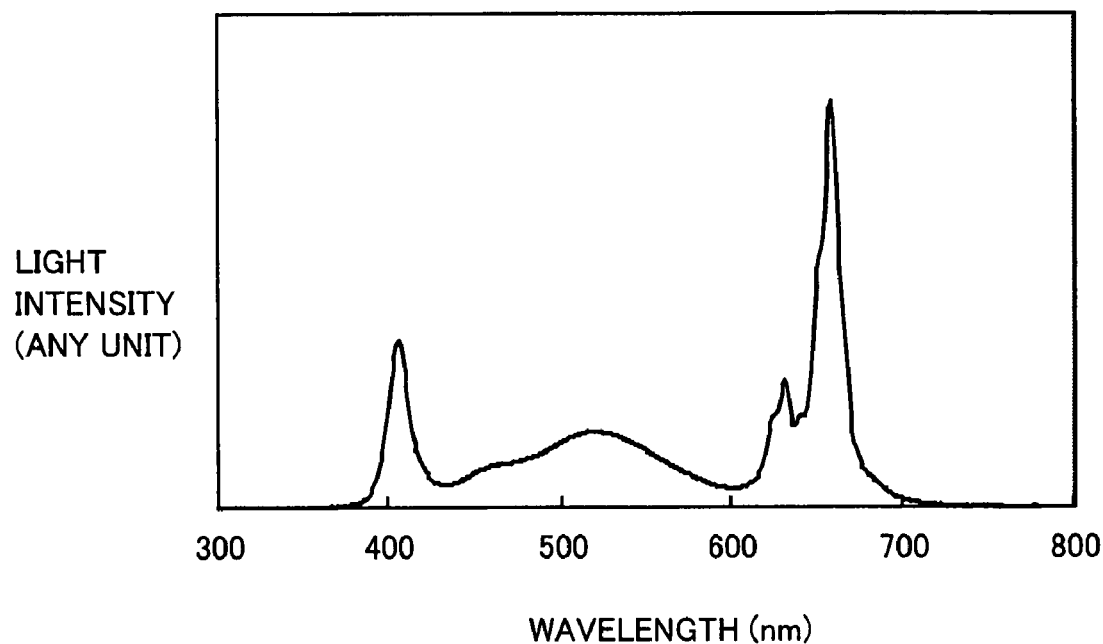
FIG. 19 shows an emission spectrum of the light emitting device obtained in Comparative Example 5.

The emission spectrum of the light emitting device obtained in Comparative Example 5 is shown in FIG. 19. In such a light emitting device, daytime white having a chromaticity coordinate x=0.35 and a chromaticity coordinate y=0.37 was obtained. Also, as seen from the emission spectrum, an average evaluation value Ra of color-rendering properties in this case was 60, which was low. The luminosity of the light emitting device of Comparative Example 5 was 1120 millicandelas (in a drive current of 40 mA of the semiconductor light emitting element).

EXAMPLE 26

By the same method as Example 25 except that the blue-green phosphor obtained in Example 4 was used as first phosphor 2, light emitting device 11 of the example shown in FIG. 13 was produced. The blend ratio of the phosphors was set to be blue-green phosphor:yellow phosphor:red phosphor=8:6:2.5 (weight ratio) and thereby, compared to Example 25, the blend ratio of first phosphor 2 was set to decrease by approximately 50% and the blend ratio of the red phosphor was set to increase by approximately 25%.

The blue-green phosphor used in the present Example and obtained in Example 4 has an emission peak wavelength of approximately 505 nm, and its emission spectrum full width at half maximum indicates a large value of approximately 120 nm, which was hardly seen in another phosphor emitting a light of blue to blue green. Moreover, light absorbance of this blue-green phosphor was 22% in a wavelength of 580 nm and 19% in a wavelength of 650 nm.

Figure 20:
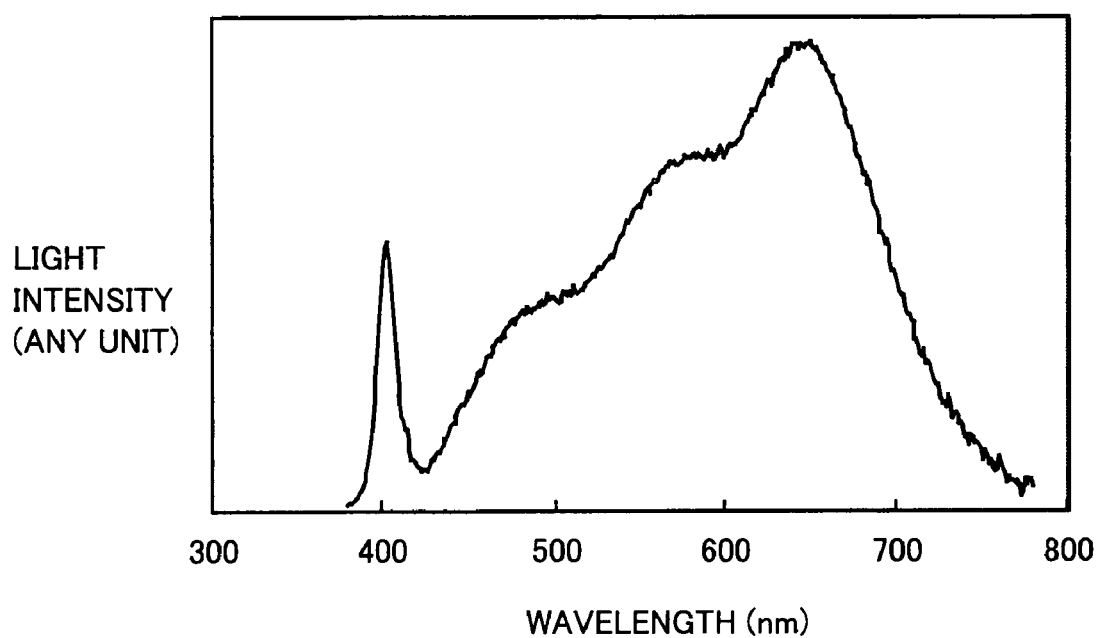
FIG. 20 shows an emission spectrum of the light emitting device obtained in Example 26.

The emission spectrum of the light emitting device obtained in Example 26 is shown in FIG. 20. The emission of this light emitting device indicated a so-called light bulb color having a chromaticity coordinate x=0.43 and a chromaticity coordinate y=0.41. Also, as seen from the emission spectrum, the emission that was very near to the emission spectrum of the standard light source A could be obtained, and an average evaluation value Ra of color-rendering properties to be a rough standard for natural emission was 94, which was high.

Moreover, the red phosphor used in the present Example has very high emission efficiency and therefore, its added amount was slightly increased and thereby, the emission intensity in the red region could be increased. Moreover, the blend ratio of the blue-green phosphor having relatively low visibility and relatively low emission efficiency was set to be low and therefore, the luminosity for a light emitting device is not degraded compared to Example 25 although the emission spectrum was a light-bulb-color type in which the amount of red components having relatively low visibility was large and of which entire luminosity was low.

EXAMPLE 27

Light emitting device 21 of the example shown in FIG. 14 was produced. As first phosphor 2, the oxynitride phosphor (blue phosphor) of the present invention that was obtained in Example 11 was used, and as second phosphor 3, α-Sialon phosphor (yellow phosphor) of the composition formula $Ca_{0.93}Eu_{0.07}Si_9Al_3ON_{15}$ was used, and as second phosphor 12, $CaAlSiN_3:Eu^{3+}$ (Eu activation amount: 0.8%) described in Kyota Uheda, Naoto Hirosaki, Hajime Yamamoto, Rong-Jun Xie, "Red phosphors for warm white light-emitting diodes" 305th meeting digest of Phosphor Research Society, 2004, pp. 37-47 was used, and as second phosphor 22, Eu-activated β-Sialon (composition: $Eu_{0.003}Si_{0.414}Al_{0.013}O_{0.005}N_{0.56528}$ (green phosphor)) described in Naoto Hirosaki, Rong-Jun Xie, Koji Kimoto, Takashi Sekiguchi, Yoshinobu Yamamoto, Takayuki Suehiro, and Mamoru Mitomo, "Characterization and properties of green-emitting β-SiALON:$Eu^{2+}$ powder phosphors for white light-emitting diodes", Applied Physics Letters 86, 211905 (2005) was used and thereby, the emission color of the light emitting device was set to be white. These phosphors were mixed at a proportion (weight ratio) of blue phosphor:yellow phosphor:red phosphor:green phosphor=16:6:2:2, and as sealing member 9, a silicone resin was used and the phosphors were dispersed and sealed in the resin. The red phosphor used in the present Example has very high emission efficiency and therefore, its added amount was set to be approximately 10% of the total sum of the phosphors. Therefore, absorption of excited light and dispersion of fluorescence by the red phosphor were small, and degradation of luminosity of the light emitting device was hardly seen. Moreover, the green phosphor used in the present Example indicates intensive emission of a wavelength of approximately 540 nm by an exited light of ultraviolet to purple, and its emission spectrum full width at half maximum is approximately 55 nm. The object of the green phosphor is to bury the valley of emission spectrum between the blue phosphor and the yellow phosphor and therefore, it is sufficient that the green phosphor has an emission spectrum full width at half maximum of 45 nm or more. In the case of the present Example, conversely, flatness of the emission spectrum becomes smaller, and the emission occasionally becomes unnatural. Moreover, as semiconductor light emitting element 4, InGaN-based semiconductor LED having an emission peak wavelength of 405 nm was used.

Figure 21:
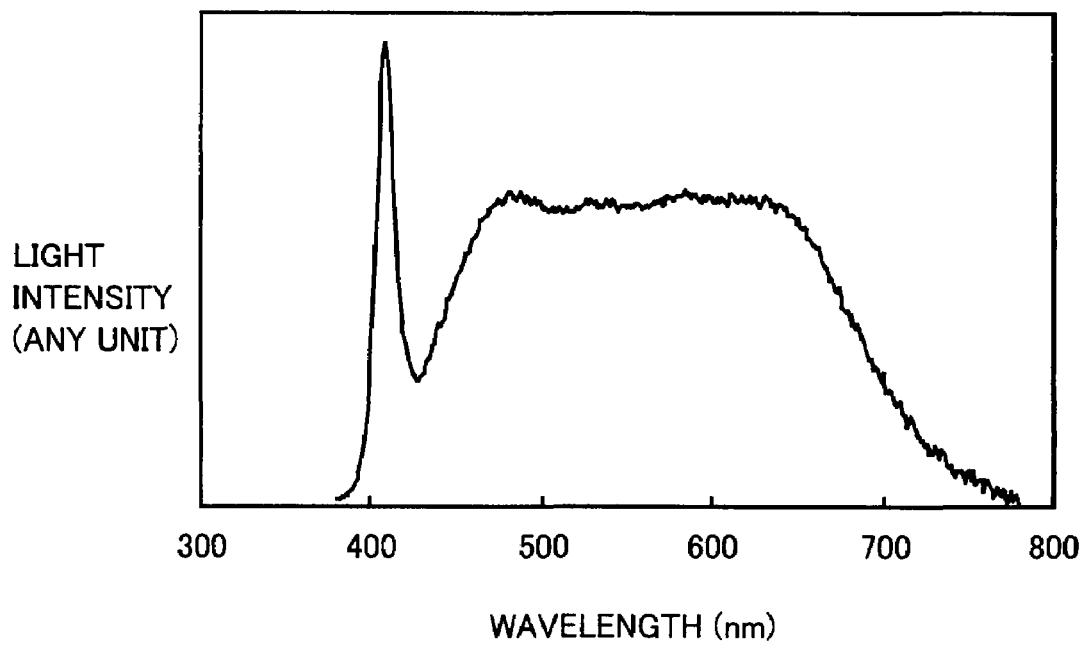
FIG. 21 shows an emission spectrum of the light emitting device obtained in Example 27.

The emission spectrum of the light emitting device obtained in Example 27 is shown in FIG. 21. In the present Example, the emission spectrum of the blue phosphor siding up to the short wavelength side was used. Thereby, the slightly generated valley of emission in a green region could be covered with the above-described green phosphor. The emission of the light emitting device of Example 27 indicated white having a chromaticity coordinate x=0.35 and a chromaticity coordinate y=0.37. Also, as seen from the emission spectrum, the emission that was uniform over the entire wavelength region of visible light could be obtained, and an average evaluation value Ra of color-rendering properties to be a rough standard for natural emission was 98, which was high.

The green phosphor used in the present Example has very high emission efficiency and additionally has an emission peak wavelength in a wavelength region having high visibility and therefore, its added amount was set to be approximately 10% of the total sum of the phosphors. Therefore, degradation of luminosity for a light emitting device due to increase of the phosphor amount was hardly seen, compared with Examples 23 and 25.

EXAMPLE 28

By the same method as Example 27 except that the phosphor (blue-green phosphor) obtained in Example 4 was used as first phosphor 2 and that α-Sialon phosphor (yellow phosphor) of the composition formula $(Ca_{0.93}Eu_{0.07})_{0.25}Si_{11.25}Al_{0.75}ON_{15.75}$ was used as second phosphor 3 and that the blend ratio was changed, light emitting device 21 shown in FIG. 14 was produced. The blend ratio of the phosphors was set to be blue phosphor:yellow phosphor:red phosphor:green phosphor=8:6.6:2.2:1.6 (weight ratio) and thereby, compared to Example 27, the blend ratio of the first phosphor was reduced by approximately 50%, the blend ratio of the green phosphor was reduced by approximately 20%, and the blend ratios of the red phosphor and the yellow phosphor were enlarged by approximately 10%.

Figure 22:
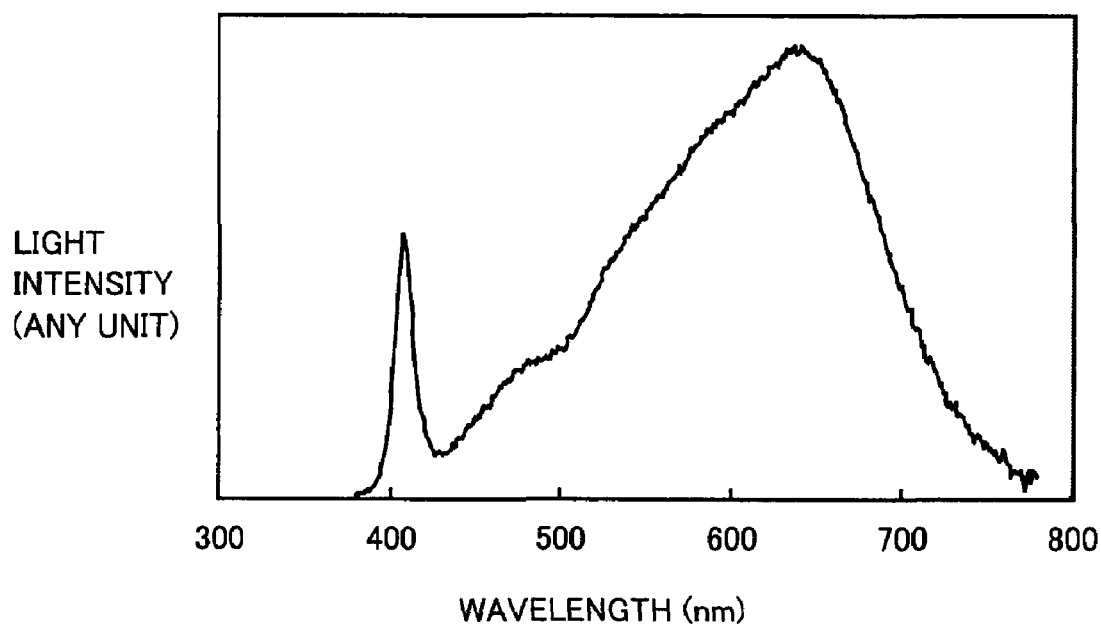
FIG. 22 shows an emission spectrum of the light emitting device obtained in Example 28.

The emission spectrum of the light emitting device obtained in Example 28 is shown in FIG. 22. The emission color of this light emitting device indicated a light-bulb color having a chromaticity coordinate x=0.45 and a chromaticity coordinate y=0.42; Also, as seen from the emission spectrum, the emission that was very near to the emission spectrum of the standard light source A could be obtained except for wavelengths of excited lights having low visibility, and an average evaluation value Ra of color-rendering properties to be a rough standard for natural emission was 97, which was very high.

Moreover, the red and yellow phosphors used in the present Example have very high emission efficiencies and therefore, their added amounts were slightly enlarged and thereby, the emission intensities of red and yellow could be enlarged. Moreover, the blend ratio of the blue phosphor was set to be low so that the emission had a light-bulb color and therefore, the luminosity for a light emitting device is not degraded compared to Example 27 although the emission has the light-bulb color having a larger proportion of lights of low visibility than that of white.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxynitride phosphor represented by a composition formula $M(1)_{1-j}M(2)_jSi_bAl_cO_dN_e$ (composition formula I) or a composition formula $M(1)_{1-a-j}M(2)_jCe_aSi_bAl_cO_dN_e$ (composition formula II); and wherein in said composition formula I, said M(1) represents La, or a material in which La serves as a main component and in which at least one kind of chemical element(s) selected from a group composed of Ce, Pr, Nd, Sm, Eu, Gd, Tb, Dy, Ho, Er, Tm, Yb, and Lu serve(s) as accessory component(s), said M(2) represents at least one kind of alkaline-earth metal(s), and a composition ratio j of said alkaline-earth metal(s) is $0<j\leq1$;

in said composition formula II, said M(1) represents La, or a material in which La serves as a main component and in which at least one kind of chemical elements selected from a group composed of Pr, Nd, Sm, Eu, Gd, Tb, Dy, Ho, Er, Tm, Yb, and Lu serve(s) as accessory component(s), said M(2) represents at least one kind of alkaline-earth metal(s), said a representing a composition ratio of Ce is a real number complying with $0.1\leq a\leq1$, and a composition ratio j of said alkaline-earth metal(s) is $0<j<1-a$;

in said composition formula I, II, said b representing a composition ratio of Si is a real number complying with $b=(6-z)\times f$, said c representing a composition ratio of Al is a real number complying with $c=(1+z)\times g$, said d representing a composition ratio of O is a real number complying with $d=z\times h$, said e representing a composition ratio of N is a real number complying with $e=(10-z)\times i$, said z is a real number complying with $0.1\leq z\leq3$, said f is a real number complying with $0.7\leq f\leq1.3$, said g is a real number complying with $0.7\leq g\leq3$, said h is a real number complying with $0.7\leq h\leq3$, and said i is a real number complying with $0.7\leq i\leq1.3$; and the oxynitride phosphor contains 50% or more of a JEM phase.

2. The oxynitride phosphor according to claim 1, wherein the oxynitride phosphor is represented by the composition formula $M(1)_{1-j}M(2)_jSi_bAl_cO_dN_e$ (composition formula I) and contains 50% or more of a JEM phase represented by a formula $M(1)_{1-j}M(2)_jAl(Si_{6-z}Al_z)N_{10-z}O_z$.

3. The oxynitride phosphor according to claim 2, wherein 70% or more of said JEM phase is contained.

4. The oxynitride phosphor according to claim 1, wherein the oxynitride phosphor is represented by the composition formula $M(1)_{1-a-j}M(2)_jCe_aSi_bAl_cO_dN_e$ (composition formula II) and contains 50% or more of a JEM phase represented by a formula $M(1)_{1-a-j}M(2)_jCe_aAl(Si_{6-z}Al_z)N_{10-z}O_z$.

5. The oxynitride phosphor according to claim 4, wherein 70% or more of said JEM phase is contained.

6. The oxynitride phosphor according to claim 1, wherein an emission peak wavelength is 450 to 510 nm.

7. The oxynitride phosphor according to claim 1, wherein said d is a real number complying with $1<d\leq2$ and said e is a real number complying with $8<e<9$.

8. The oxynitride phosphor according to claim 1, wherein the oxynitride phosphor is represented by the composition formula $M(1)_{1-a-j}M(2)_jCe_aSi_bAl_cO_dN_e$ (composition formula II), and said alkaline-earth metal(s) contain(s) calcium.

9. The oxynitride phosphor according to claim 8, wherein a composition ratio of said calcium is $0<j<0.75$.

10. The oxynitride phosphor according to claim 8, wherein a composition ratio of said calcium is $0<j<(1-a)\times0.75$.

11. The oxynitride phosphor according to claim 1, wherein the oxynitride phosphor is represented by the composition formula $M(1)_{1-a-j}M(2)_jCe_aSi_bAl_cO_dN_e$ (composition formula II), and said alkaline-earth metal(s) contain(s) strontium.

12. The oxynitride phosphor according to claim 11, wherein a composition ratio of said strontium is $0<j<0.85$.

13. The oxynitride phosphor according to claim 11, wherein a composition ratio of said strontium is $0<j<(1-a)\times0.85$.

14. The oxynitride phosphor according to claim 1, wherein the oxynitride phosphor is represented by the composition formula $M(1)_{1-a-j}M(2)_jCe_aSi_bAl_cO_dN_e$ (composition formula II), and said alkaline-earth metal(s) contain(s) barium.

15. The oxynitride phosphor according to claim 14, wherein a composition ratio of said barium is $0<j<0.5$.

16. The oxynitride phosphor according to claim 14, wherein a composition ratio of said barium is $0<j<(1-a)\times0.5$.

17. The oxynitride phosphor according to claim 1, wherein an absorbance of a light having a wavelength of 510 to 800 nm is 30% or less.

18. A light emitting device comprising
a semiconductor light emitting element emitting an excited light,
a first phosphor that is the oxynitride phosphor according to claim 1 that absorbs said excited light and emits a fluorescence, and
a kind or a plurality of kinds of second phosphor(s) that absorb(s) said excited light and emit(s) a fluorescence having a longer wavelength than the fluorescence emitted by said first phosphor.

19. The light emitting device according to claim 18, wherein an emission peak wavelength of said first phosphor is 450 to 510 nm.

20. The light emitting device according to claim 18, wherein an emission spectrum full width at half maximum of said first phosphor is 80 nm or more.

21. The light emitting device according to claim 18, wherein a chromaticity coordinate x of emission of said first phosphor is 0.05 to 0.25, and a chromaticity coordinate y thereof is 0.02 to 0.38.

22. The light emitting device according to claim 18, wherein one main kind of emission peak wavelength of said second phosphor(s) is 565 to 605 nm.

23. The light emitting device according to claim 18, wherein one main kind of an emission spectrum full width at half maximum of said second phosphor(s) is 80 nm or more.

24. The light emitting device according to claim 18, wherein said second phosphor(s) include(s) an oxynitride phosphor.

25. The light emitting device according to claim 24, wherein said second phosphor(s) include(s) an Eu-activated α-Sialon phosphor.

26. The light emitting device according to claim 24, wherein said second phosphor(s) include(s) an Eu-activated β-Sialon phosphor.

27. The light emitting device according to claim 18, wherein said second phosphor(s) include(s) a nitride phosphor.

28. The light emitting device according to claim 27, wherein said second phosphor(s) include(s) Eu-activated $CaAlSiN_3$.

29. The light emitting device according to claim 18, wherein an emission peak wavelength of said excited light is 350 to 420 nm.

30. The light emitting device according to claim 18, wherein a chromaticity coordinate x of emission of said light emitting device is 0.22 to 0.44 and a chromaticity coordinate y thereof is 0.22 to 0.44, or a chromaticity coordinate x of emission of said light emitting device is 0.36 to 0.5 and a chromaticity coordinate y thereof is 0.33 to 0.46.

* * * * *